United States Patent
Delcamp et al.

(10) Patent No.: US 9,324,505 B2
(45) Date of Patent: Apr. 26, 2016

(54) COMPOUNDS FOR ELECTROCHEMICAL AND/OR OPTOELECTRONIC DEVICES HAVING PERI-FUSED RING SYSTEM

(75) Inventors: Jared Delcamp, Lutry (CH); Michael Graetzel, St-Sulpice (CH); Mohammad Khaja Nazeeruddin, Ecublens (CH)

(73) Assignee: Ecole Polytechnique Federale de Lausanne (EPFL) EPFL-TTO, Lausanne (CH)

( * ) Notice: Subject to any disclaimer, the term of this patent is extended or adjusted under 35 U.S.C. 154(b) by 81 days.

(21) Appl. No.: 14/349,792

(22) PCT Filed: Oct. 18, 2011

(86) PCT No.: PCT/IB2011/054628
§ 371 (c)(1),
(2), (4) Date: Apr. 4, 2014

(87) PCT Pub. No.: WO2013/057538
PCT Pub. Date: Apr. 25, 2013

(65) Prior Publication Data
US 2014/0239288 A1    Aug. 28, 2014

(51) Int. Cl.
*H01L 51/00* (2006.01)
*H01G 9/20* (2006.01)

(52) U.S. Cl.
CPC .......... *H01G 9/2059* (2013.01); *H01L 51/0064* (2013.01); *H01L 51/0067* (2013.01); *H01L 51/0069* (2013.01); *Y02E 10/542* (2013.01); *Y02E 10/549* (2013.01); *Y02P 70/521* (2015.11)

(58) Field of Classification Search
CPC .................................................. H01L 51/0064
See application file for complete search history.

(56) References Cited

U.S. PATENT DOCUMENTS 7,781,076 B2 * 8/2010 Shukla et al. .................. 428/690
8,338,824 B2 * 12/2012 Nishi et al. ....................... 257/40
8,372,527 B2 * 2/2013 Morishita et al. ............. 428/690

FOREIGN PATENT DOCUMENTS

JP      2003327549 A    11/2003

OTHER PUBLICATIONS

Balli, Heinz, Zeller, Martin, 210, Neue Heteroarene: Synthese and spektrale Daten von Indloizino [6, 5, 4, 3-aiij] (<<Ullazin>>) unde einigen Derivaten, 1983, pp. 2135-2137, vol. 66, Facs. 7, Helevetica Chimica Acta.

Kanno, Ken-ichiro et al., Chromium-Mediated Synthesis of Polycyclic Aromatic Compounds from Halobiaryls, 2005, pp. 5453-5456, vol. 7, No. 24, American Chemical Society.

* cited by examiner

*Primary Examiner* — Stephen W Smoot
(74) *Attorney, Agent, or Firm* — Taft Stettinius & Hollister LLP

(57) ABSTRACT

The invention relates to substituted ullazine and analogs of ullazine as sensitizers for dye-sensitized solar cells (DSSCs) and other photoelectrochemical and/or optoelectronic devices. The sensitizers may comprise donor substituents and/or acceptor substituents, besides an anchoring group suitable for attaching the sensitizer on a semiconductor surface. DSSCs based on this type of sensitizers exhibit high power conversion efficiencies.

15 Claims, 10 Drawing Sheets

COMPOUNDS FOR ELECTROCHEMICAL AND/OR OPTOELECTRONIC DEVICES HAVING PERI-FUSED RING SYSTEM

TECHNICAL FIELD

The present invention relates to novel compounds, electrochemical and/or optoelectronic devices comprising the compounds, to the use of the compounds as sensitizers, to methods of sensitizing a semiconductor surface, and to methods of preparing electrochemical and/or optoelectronic devices.

PRIOR ART AND THE PROBLEM UNDERLYING THE INVENTION

The use of conventional fossil fuels as energy resource poses well-known environmental problems, as well as problems of shortage in the medium to long term. In order to solve the approaching energy crisis, a variety of attempts have been performed. Among the available alternatives, the solar energy, used in photovoltaic cells, is almost unlimited and environment-friendly compared to other forms of energy. The silicon solar cell dominates the photovoltaic business due to the high light-to-electricity conversion efficiency and due to the fact that the technology developed for many decades, is mature. However, silicon solar cells suffer from the disadvantages of a high cost of the production process, expensive raw materials and the difficulty of further increasing the efficiency of the cells.

Dye sensitised solar cells (DSSCs) make use of photosensitive dye molecules (sensitizers) and transition metal oxides, which perform the functions of absorbing visible light, producing electron-hole couples, and transporting the electron produced by light absorption, respectively. DSSCs have many advantages, such as high efficiency, low production cost, low energy consumption during manufacturing, and environmental friendly production. For example, in low light conditions, DSSCs perform with higher efficiency than silicon-based technology. These properties have given these cells high prospects in the photovoltaic business. In 1991, Prof. Michael Grätzel at the École Polytechnique Fédérale de Lausanne developed a technological breakthrough in these cells. Since then, DSSCs have gradually become a research topic of high interest in the field of solar cells (Nature 1991, 353, 737). So far, DSSCs with high efficiency usually use sensitizers containing a noble metal, as is the case in bipyridine ruthenium complexes, for example (J. Am. Chem. Soc. 2005, 127, 16835-16847). However, the practical application of such complexes is limited by the high price of noble metals and their limited resource. Compared to bipyridine ruthenium complex, organic dyes show some advantages, such as low cost, high extinction coefficient and the possibility of modifying the structure easily. Recently, in the field of DSSCs, efforts have been made for replacing ruthenium dyes with organic dyes (J. Am. Chem. Soc. 2006, 128, 16701-16707).

In particular, the present invention addresses the objectives of providing new dyes with low production cost, and high stability, resulting in enhanced solar-to-electricity conversion devices.

Furthermore, it is a more general objective to provide new chromophores and/or sensitizing dye core structures, which are suitable for further adaptation and improvement, for example by using selected acceptor and donor substituents on a sensitizer core structure. In this way, the properties of the dye may advantageously adjusted, for example to maximize photons absorbed and converted to electricity and in accordance with the electrolyte chosen.

It is also an objective of the invention to provide chromophores and/or dye core structures that can be combined with substituents that can function as ligand moiety. This would enable the use of such chromophores also in the transition metal based complexes as detailed above. Advantageously, chromophores are provided that can be used in any dye-sensitized solar cell type (solvent and/or ionic liquid based wet cells and solid state cells), which may be used as organic sensitizers but which may also be substituted on polypyridyl ligands to be used as a coordinating ligand in metal-based complexes.

The inventors are aware of the following prior art references, which do, however, not relate to the concept underlying the present invention but may provide background information. Gerson and Metzger, 1983, Hely. Chim. Acta, 66, 7, no. 200, 2031-2043; Balli and Zeller, 1983, Hely. Chim. Acta, 66, 7, no. 210, 2135-2139; Org. Lett., 2005, 7, no. 24, 5453-5456; A. Juris, V. Balzani, F. Barigelletti, S. Campagna, P. Belser, A. von Zelewsky, Coord. Chem. Rev., 1988, 84, 85; Tominaga, Y. Article: Science of Synthesis (2004), 17, 1025-1079; and JP2003327549.

SUMMARY OF THE INVENTION

The present invention discloses a novel series of sensitizers. Remarkably, the present inventors found core structures comprising four fused rings forming a heteroatomic 16 π-electron ring system, which are useful is dyes of dye-sensitized solar cells (DSSCs). The 16 π-electron ring system forms different cores structures that can be used for the preparation of organic dyes, but can also be further functionalized so as to be useful in dyes based on transition metal complexes. DSSCs comprising the dyes as part of a light absorption layer yield surprisingly high power conversion efficiencies (η).

In an aspect, the present invention provides a compound comprising and/or consisting of a substituted 16 π-electron ring system comprising four peri-fused rings, said ring system comprising at least one nitrogen heteroatom.

In an aspect, the present invention provides a compound comprising a structure according to any one of formulae (I) to (VIII) below:

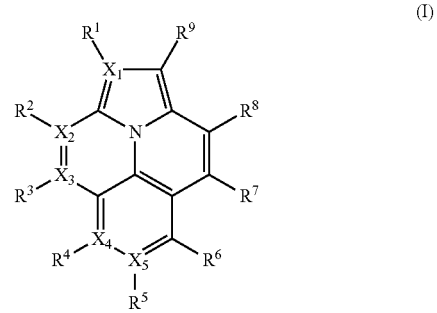

(I)

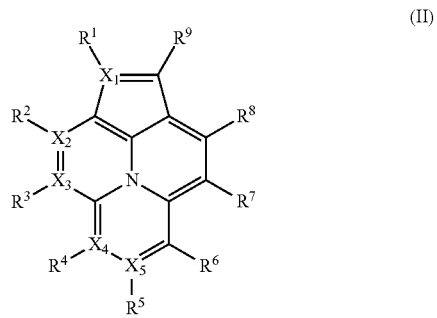

(II)

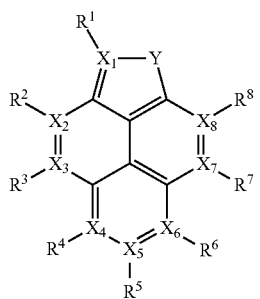
(III)

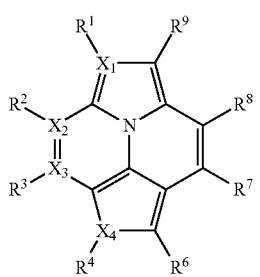
(IV)

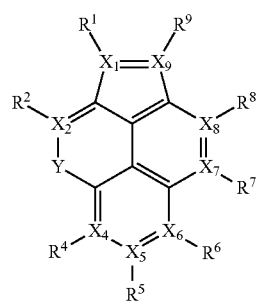
(V)

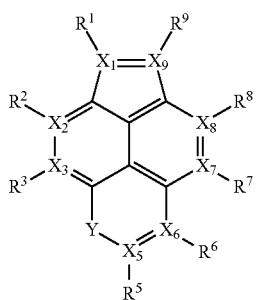
(VI)

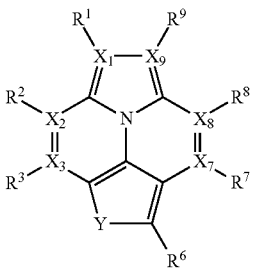
(VII)

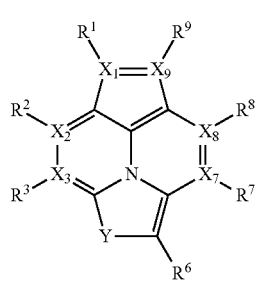
(VIII)

wherein the atoms $X_1$, $X_2$, $X_3$, $X_4$, $X_5$, $X_6$, $X_7$, $X_8$, $X_9$, in as far as present, are either all carbon atoms or one may independently be nitrogen and the other being carbons;

if any one $X_1$, $X_2$, $X_3$, $X_4$, $X_5$, $X_6$, $X_7$, $X_8$, $X_9$, in as far as present, is nitrogen, the respective substituent ($R^1$, $R^2$, $R^3$, $R^4$, $R^5$, $R^6$, $R^7$, $R^8$, $R^9$, respectively) is absent;

Y is selected, independently, from O, S, Se, $SiR^{10}R^{11}$ and $NR^{10}$;

$R^1$, $R^2$, $R^3$, $R^4$, $R^5$, $R^6$, $R^7$, $R^8$, $R^9$, in as far as present, are selected independently from H, and C1 to C40 hydrocarbons comprising 0 to 20 heteroatoms, and from C0 to C40 hydrocarbons comprising 1 to 20 heteroatoms; with the proviso that at least one of $R^1$, $R^2$, $R^3$, $R^4$, $R^5$, $R^6$, $R^7$, $R^8$, $R^9$ comprises an anchoring group; and, $R^{10}$ are $R^{11}$ independently selected from H and C1 to C40 hydrocarbons comprising 0 to 20 heteroatoms.

In a further aspect, the present invention provides a compound according to any one of formulae (IX) to (XVII) below:

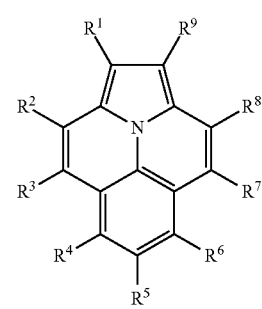
(IX)

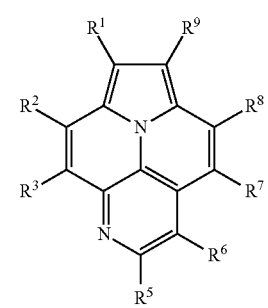
(X)

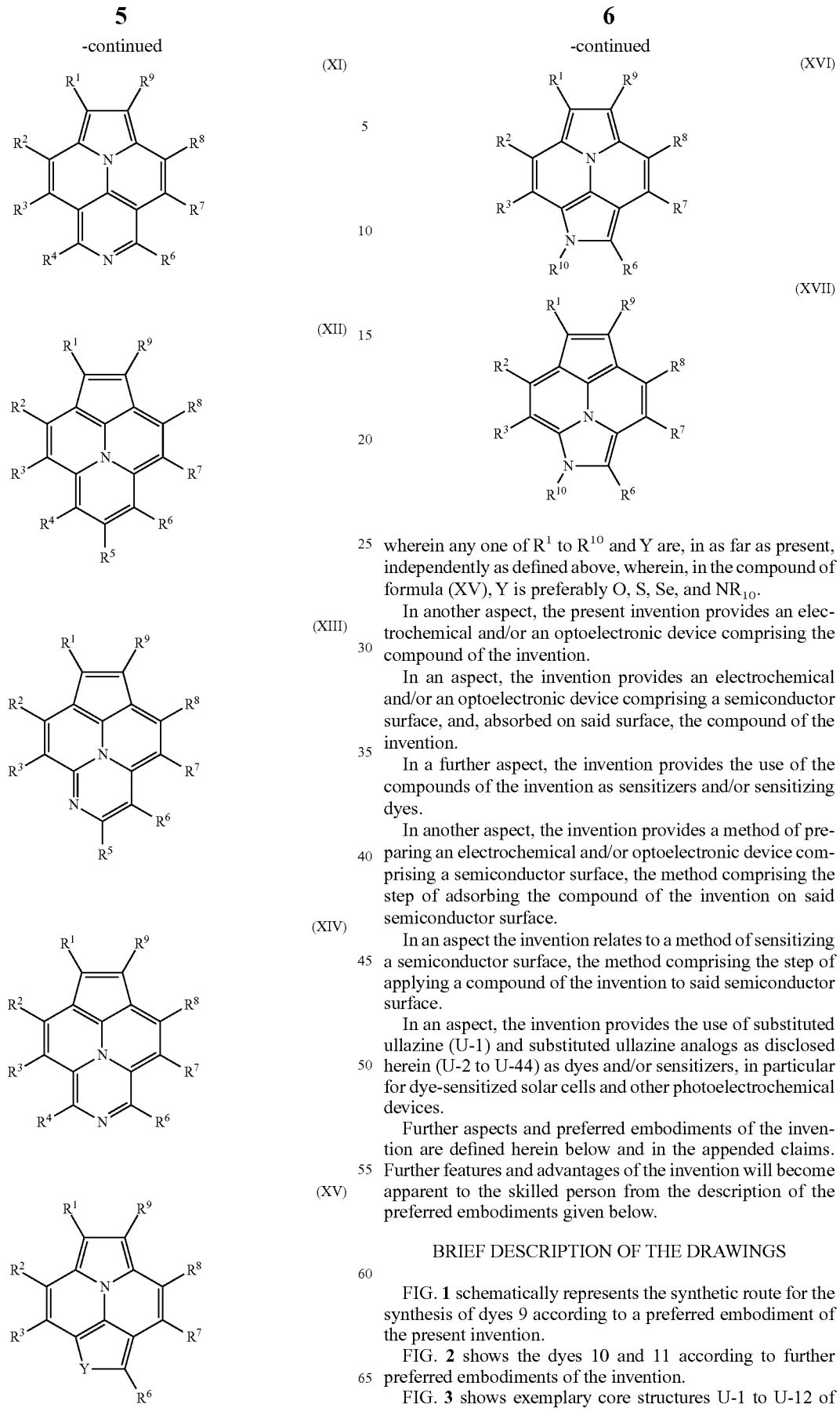

wherein any one of $R^1$ to $R^{10}$ and Y are, in as far as present, independently as defined above, wherein, in the compound of formula (XV), Y is preferably O, S, Se, and $NR_{10}$.

In another aspect, the present invention provides an electrochemical and/or an optoelectronic device comprising the compound of the invention.

In an aspect, the invention provides an electrochemical and/or an optoelectronic device comprising a semiconductor surface, and, absorbed on said surface, the compound of the invention.

In a further aspect, the invention provides the use of the compounds of the invention as sensitizers and/or sensitizing dyes.

In another aspect, the invention provides a method of preparing an electrochemical and/or optoelectronic device comprising a semiconductor surface, the method comprising the step of adsorbing the compound of the invention on said semiconductor surface.

In an aspect the invention relates to a method of sensitizing a semiconductor surface, the method comprising the step of applying a compound of the invention to said semiconductor surface.

In an aspect, the invention provides the use of substituted ullazine (U-1) and substituted ullazine analogs as disclosed herein (U-2 to U-44) as dyes and/or sensitizers, in particular for dye-sensitized solar cells and other photoelectrochemical devices.

Further aspects and preferred embodiments of the invention are defined herein below and in the appended claims. Further features and advantages of the invention will become apparent to the skilled person from the description of the preferred embodiments given below.

BRIEF DESCRIPTION OF THE DRAWINGS

FIGS. 5-1 and 5-2 show exemplary donor substituents that are connected to any one core structure indicated as ULA. Preferred core structures are shown in FIGS. 3 and 4. The definition for R is given in the detailed description.

FIGS. 6-1 and 6-2 show exemplary acceptor substituents that are connected to any one core structure indicated as ULA. Preferred core structures are shown in FIGS. 3 and 4. The definitions for R, W, $R_A$ and "Anch" are given in the detailed description.

DETAILED DESCRIPTION OF THE PREFERRED EMBODIMENTS

The present invention provides compounds that are useful for photoelectric and/or optoelectronic devices.

The compounds of the invention comprises a substituted 16 π-electron ring system comprising at least one nitrogen atom. The 16 π-electron ring system forms a core element or structure, which is substituted. According to an embodiment, the ring system comprises four fused rings, in particular four peri-fused rings.

16 π-electron ring system comprising at least one nitrogen atom may also be referred to herein as "core structure", "core system", and "core ring system", for example "16 π-electron core structure".

For the purpose of the present invention, a "peri-fused ring" is a ring that is fused through more than one face. In other words, a peri-fused ring shares two or more of its ring bonds (single, double or triple bonds) with other rings. A peri-fused ring is thus generally fused to at least two other rings. In the 16 π-electron ring system, preferably all four rings are peri-fused rings.

According to an embodiment, in said compound, two of said four rings (the bottom and top rings shown in the systems in FIG. 3) have each a bond and/or two atoms in common with each of two other rings of said four rings, said two other rings (the lateral rings as shown in the ring systems in FIG. 3) having each a bond and/or two atoms in common with each of the other three rings of said four rings. This corresponds to the structure found in pyrene, for example, with one difference to some embodiments of the invention being that the 16 π-electron ring system of the invention comprises at least one nitrogen atom.

Figure 3:
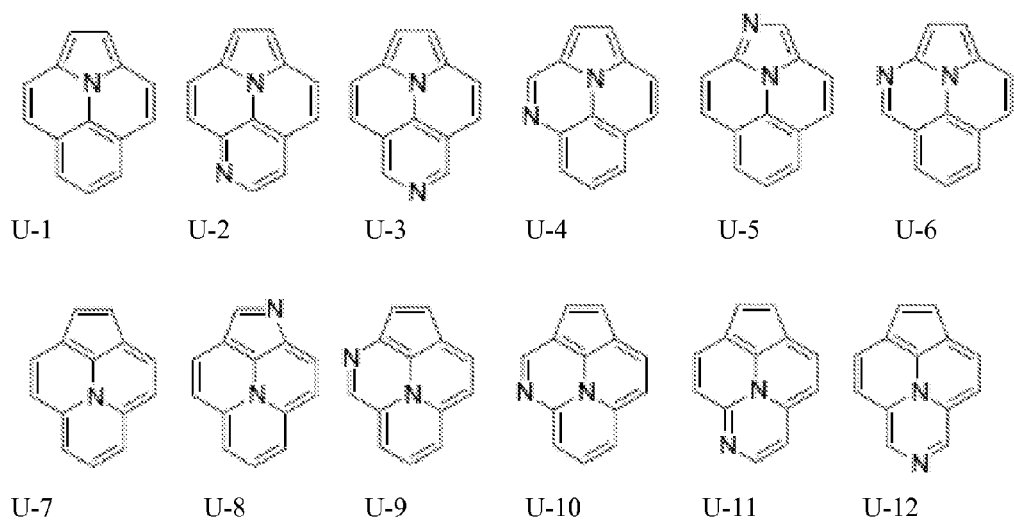
FIG. 3 shows exemplary core structures U-1 to U-12 of sensitizing dyes according to preferred embodiments of the invention.

An exemplary and particularly preferred core structure in accordance with the invention is Ullazine, which is shown as compound U-1 in FIG. 3. The synthesis of U-1 has been disclosed by H. Balli and M. Zeller, 1983, Hely. Chim. Acta, 66, 7, pp. 2135-2139. The further core structures shown in FIGS. 3 and 4 are analogs of U-1, which are also preferred 16 π-electron core structures in accordance with the present invention.

U-1 corresponds to the compound of formula (I), in which $X_1$ to $X_5$ are all carbons as more specifically shown in formula (IX). According to this embodiment, all substituents $R^1$ to $R^9$ are thus present and may be selected as detailed elsewhere in this specification.

Figure 4:
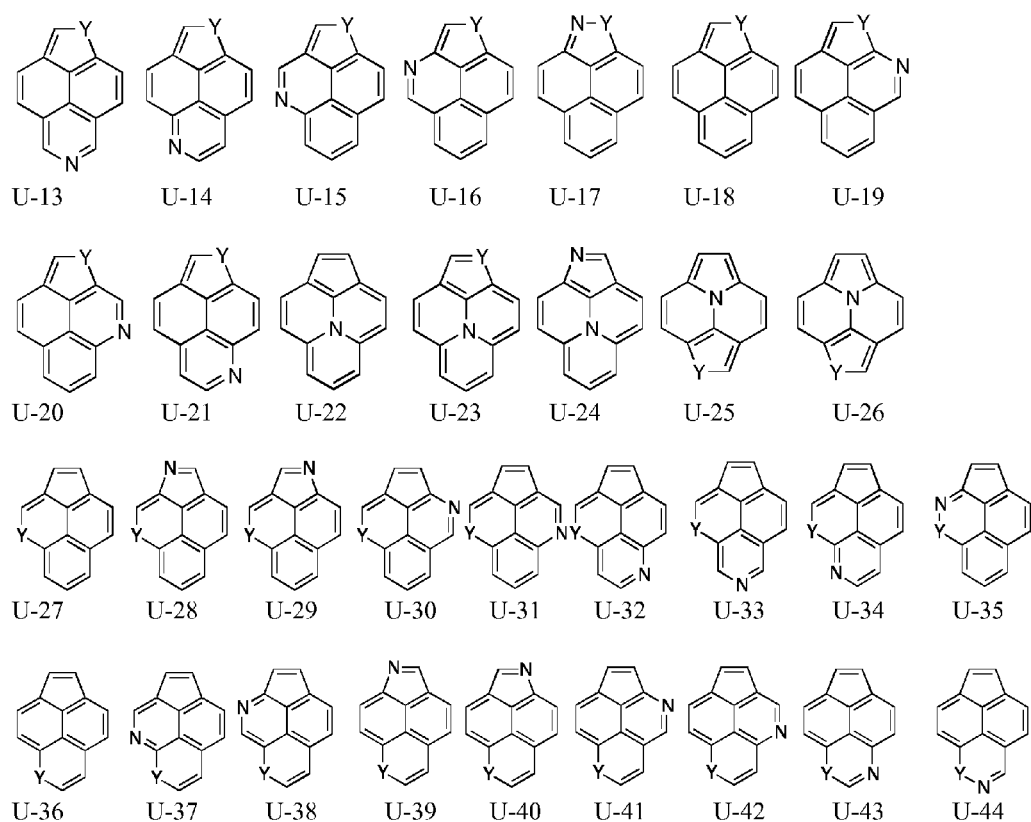
FIG. 4 shows further exemplary core structures U-13 to U-44 of sensitizing dyes according to preferred embodiments of the invention. In these core structures Y may be selected from O, S, Se, $SiR^{10}R^{11}$ and $NR^{10}$ as defined elsewhere in this specification.

Further core structures in accordance with the invention are structure formulae U-2 to U-12 in FIG. 3 and U-13 to U-44 in FIG. 4. The compound of the invention may be based on any one of these core structures, substituted as specified in this specification. Y in FIG. 4 is as defined with respect to formulae (III), (V), (VI), (VII) and (VIII) elsewhere in this specification. In particular, Y is selected from O, S, Se, $NR^{10}$, $SiR^{10}R^{11}$, $R^{10}$ and $R^{11}$ being defined elsewhere in this specification. According to an embodiment, $R^{10}$ and $R^{11}$ are selected independently from substituents as defined for $R_{41}$ and $R_{42}$.

According to an embodiment, in any one compounds according to any one of formulae (III), (V), and (VI), one or more of $X_1$, $X_2$, $X_3$, $X_4$, $X_5$, $X_6$, $X_7$, $X_8$, $X_9$ is nitrogen.

According to an embodiment, said compound of formula (I) is selected from compounds of formulae (IX) to ($X_1$); said compound of formula (II) is selected from compounds of formulae (XII) to (XIV); said compound of formula (IV) is a compound according to formulae (XV); said compound of formula (VII) is a compounds of formulae (XVI); and said compound o formula (VIII) is a compound of formula (XVII).

In accordance with a general embodiment of the present invention, the expression "selected from" encompasses the meaning "selected from a group consisting of".

In accordance with the invention, the 16 π-electron core structure is substituted. In the compounds of formulae (I) to (VIII), this means that at least one of $R^1$ to $R^9$ is present and is different from H.

Substituents are preferably selected from substituents carrying an anchoring group, donor substituents, acceptor substituents and combinations of the aforementioned, in particular also from acceptor substituents comprising an anchoring group. The substituents may, independently comprise linker moieties as disclosed herein.

In general, any one of $R^1$, $R^2$, $R^3$, $R^4$, $R^5$, $R^6$, $R^7$, $R^8$, $R^9$ may be any one selected from the above-mentioned substituents.

According to an embodiment, 1, 2, 3, 4, 5, 6, 7, or 8, preferably two or three selected from $R^1$ to $R^9$ are donor substituents, preferably as defined elsewhere in this specification.

According to an embodiment, 1, 2, 3, 4, 5, 6, 7, or 8, preferably one or two, selected from $R^1$ to $R^9$ are acceptor substituents, preferably as defined elsewhere in this specification.

According to an embodiment, the compound of the invention comprises the core structure comprising one or more donor substituent.

According to an embodiment, the compound of the invention substituent is free of a substituent to the core structure, optionally via a linker, which substituent has donor properties and which substituent lacks is devoid of any acceptor group or properties.

According to an embodiment, the compound of the invention comprises the core structure comprising one or more acceptor substituent.

According to an embodiment, the compound of the invention comprises the core structure comprising one or more acceptor and one or more donor substituent.

According to an embodiment, the compound of the invention comprises the core structure and a substituent comprising an anchoring group, which may connected directly to the core structure, to a linker substituent or moiety, to a donor substituent and/or to an acceptor substituent. The anchoring group may also be part of a donor substituent and/or of an acceptor substituent.

According to an embodiment, there are more donor substituents than acceptor substituents in the compounds of the invention.

According to a preferred embodiment, $R^2$ and $R^8$ are donor substituents as defined elsewhere in this specification, and $R^4$ and/or $R^6$ are acceptor substituents as defined herein, said acceptor substituents optionally comprising an anchoring group. Linkers as defined herein may be used to link said substituents to the core structure.

In particular, at least one of the substituents of the core structure is a substituent comprising an anchoring group. The anchoring group is suitable to anchor said compound on the surface of a semiconductor. In particular, the compound having the core structure is preferably in any way adsorbed or attached on a surface of said semiconductor, in particular by way of said anchoring group.

Anchoring groups may be referred to as "—$R_{Anch}$", "-Anch", "-Anch" or "Anch" in the context of this specification.

The connection of the compound onto the semiconductor surface by way of an anchoring group can be by way of electrostatic interaction and/or of covalent connection and/or coordinate covalent, which is stable for at least 10 hours, preferably at least 10 weeks, more preferably at least 10 months and ideally up to and more than 1-3 years.

According to an embodiment, any anchoring group (Anch) is selected, independently, from any other anchoring group, from —COOH, —$PO_3H_2$, —$PO_4H_2$, —$P(R^{12})O_2H$ (phosphinic acid); —$SO_3H_2$, —$SO_4H_2$, —CONHOH⁻, 1,2 hydroxy benzene, 1-hydroxy-2-carboxy benzene, acetylacetonate, deprotonated forms of the aforementioned, organic and/or inorganic salts of said deprotonated forms, and chelating groups with π-conducting character.

$R^{12}$ may be a hydrocarbon comprising from 1 to 50 carbons and 0-25 heteroatoms, said hydrocarbon being covalently bound to the P atom of said phosphinic acid group by a carbon atom. $R^{12}$ may be further covalently connected to a substituent carrying the anchoring group Anch, to another substituent as specified elsewhere in this specification, such as a donor or acceptor substituent, or to the core structure, for example. $R^{12}$ may a substituted or unsubstituted, linear, branched or cyclic C1-C20 alkyl, for example as defined elsewhere in this specification, such as with respect to alkyls of linker moieties.

An example of an anchoring group is acetylacetonate of formula (Anch3) below, wherein Anch3 is connected by a covalent bond to any one selected from carbon 1, 3 or 5.

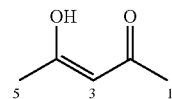
(Anch3)

As the skilled person appreciates, the keto and enol tautomeric forms of the anchoring group Anch3 coexist in solution, which are thus both encompassed by the present invention.

Without wishing to be bound by theory, it cannot be excluded that the proton of the anchoring group may have some undesired properties when adsorbed on the surface. Therefore, the inventors believe that it may advantageous if one or more of the anchoring groups are provided in a deprotonated form. Individual deprotonated anchoring groups may be provided in the form of salts of inorganic compounds (for example metals with the charge 1+) or organic cations. A preferred organic cation in this respect is tetrabutylammonium or a substituted or unsubstituted imidazolium.

An anchoring group may be provided in many ways to said core structure. Generally, the anchoring group may be directly connected to the core structure. In this case, any one of $R^1$ to $R^9$ is directly an anchoring group, such as, for example, —COO⁻, —$PO_3H_2$, or Anch3 above, wherein said core structure may be connected by way of a single bond to any one of carbons 1, 3 or 5 of Anch3. Of course, these are only arbitrary examples for illustrating this way of providing one or more anchoring groups on the compound of the invention.

An anchoring group may also be connected indirectly to the core structure, for example via a linker, or via any one of the substituents disclosed in this specification, for example the acceptor or donor substituents as specified elsewhere in this specification. In this case, the anchoring group is only a structural element or part of the substituent $R^1$ to $R^9$ that comprises the anchoring group. According to an embodiment, the anchoring group is part of a substituent that further comprises an acceptor group and/or that forms an acceptor substituent.

The anchoring group may in general be connected in a π-conducting manner to the core structure, on in another way. In the case of the acceptor substituents A-7, A-8 and A-9 shown in FIG. 6-1, and compound 11 in FIG. 2, for example, the anchoring group is bridged by a methylene group to the remainder of the acceptor substituent, which means that the anchoring group is not connected in a π-conducting manner to the remainder of said acceptor substituent. In this case, the anchoring group is connected in an isolated, non-electron-conducting manner to the substituent and thus to said core structure.

Accordingly, the non-π-conducting linker of the anchoring group may have any structure, and may thus be selected from any hydrocarbon optionally comprising heteroatoms. Preferred non-π-conjugated linkers are C1 to C10 alkyldiyls, C2-C10 non-conjugated alkenyldiyls, C2-C10 non-conjugated alkynyldiyls, any one of which may be linear or branched and/or cyclic, and which may be further substituted. Preferred alkyldiyls are methylene, ethylene and propylene. The non-conjugated linker may connect the anchoring group to one or more selected from the core structure, a donor substituent, an acceptor substituent and to a π-conjugated linker as defined elsewhere in this specification, for example.

Figures 1, 6:
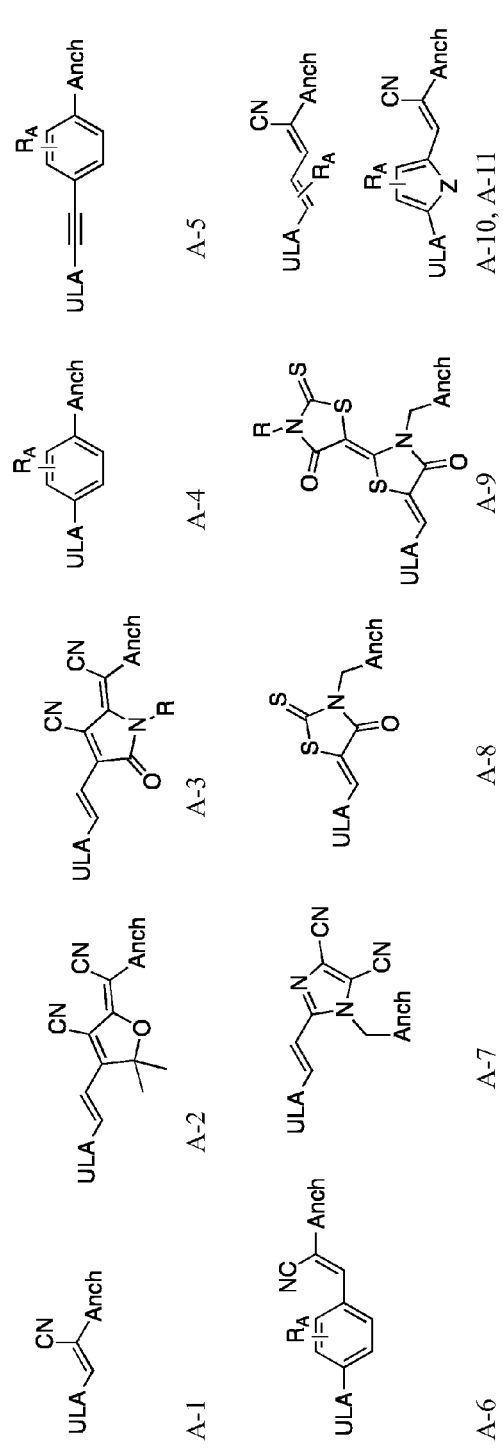
Figures 2, 6:
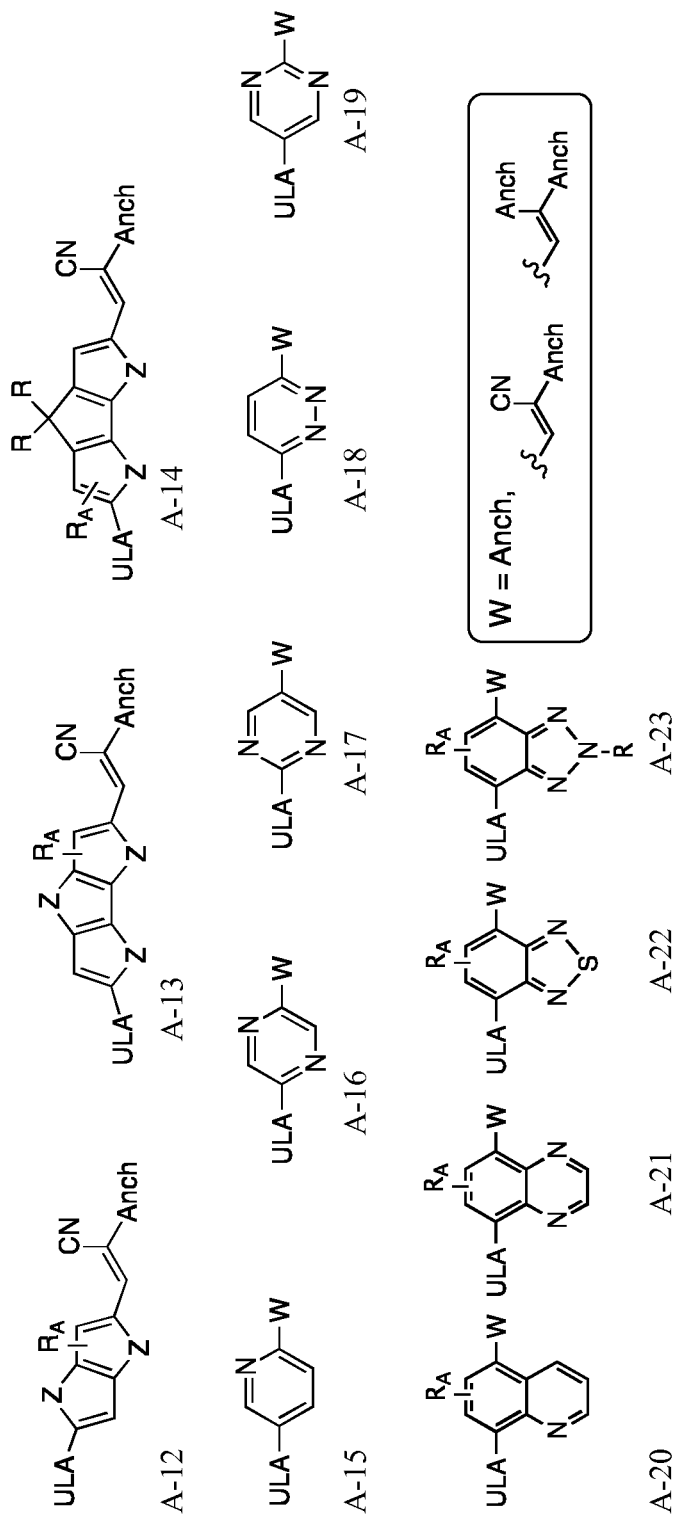

In the case of substituents A-1 to A-6 and A-10 to A-23 in FIG. 6, however, the anchoring group is connected in a π-conducting manner to the remainder of the substituent and thus also to the core structure. Since some anchoring groups, such as —COOH, have them-selves acceptor properties, it is preferable to connect the anchoring groups in a π-conducting manner to the (or as part of) an acceptor substituent, as is discussed in more detail elsewhere in this specification.

It is noted that there may be more than one anchoring group present. If there are two or more anchoring groups, each anchoring group may be connected independently from each other in different manner, by way of a different substituent ($R^1$ to $R^9$) or directly as one of said substituents to the core structure. In summary, anchoring groups, independently, may (but need not) be separated from the core structure by way of a donor substituent, an acceptor substituent, by any π-conducting linker or by a non-conducting linker.

The anchoring group, or if there are several, the anchoring groups, and other functional groups and/or substituents referred to herein, such as the donor and acceptor substituents discussed elsewhere in this specification, may independently be connected to the core structure by way of a linker.

In case of the donor and/or acceptor substituents, the linker has preferably π-conducting character and/or a conjugated system (also referred to as π-conjugated linker). In other words, the linker connects a particular substituent in a π-conducting manner to said core structure. In case of the anchoring group, the linker may but need not have π-conducting character, as mentioned above. Preferably, however, the anchoring group is also connected to the core structure by way of a linker having π-conducting character. According to a preferred embodiment, the anchoring group is part of or connected to one or more of acceptor substituents that are preferably present. Preferably, the anchoring group is directly connected or by way of a π-conducting linker to said acceptor substituent(s).

A conjugated system (or having π-conducting character) has a region of overlapping π-orbitals, bridging the interjacent single bonds. They allow a delocalization of π-electrons across all the adjacent aligned π-orbitals. The π electrons do thus not belong to a single bond or atom, but rather to a group of atoms.

A linker having π-conducting character is a linker connecting two structural elements by a continuous system of conjugated double bonds and/or conjugated aromatic moieties, the latter containing conjugated double bonds by way of definition. Simple linkers are, for example, vinylene (———) or phenylene, but more complex systems comprising a combination of different aryls (including heteroaryls), of one or more vinylene and/or ethynylene moieties with arylene moieties, for example, are also encompassed by the invention. It is noted that such linkers may contain further substituents of any kind, as long as such further substituents do not interrupt the π-conducting character and/or as far as a continuous system of conjugated double bonds and/or π-conducting character persists.

The expression "in a π-conjugated manner", typically occurring in a larger expression such as "connecting (a given substituent or functional group) in a π-conjugated manner to the 16 π-electron ring system" refers generally to a direct attachment of the respective substituent of functional group to the core structure or by way of a π-conjugated linker, so that generally an overall π-conjugated connection is obtained, for example via a 7π-conjugated linker.

Exemplary arylene moieties are phenylene, naphthalene(-diyl), anthracene, phenanthren, and so forth, including heteroarylene moieties comprising thiophene, furan, pyridine, pyrazine, and so forth.

There is no particular limitation with respect to the size of the linker, but it is preferred that the linker has not more than up to 50 carbons and 0-30 heteroatoms, preferably not more than up to 40 carbons and 0-20 heteroatoms, more preferably not more than up to 30 carbons and 0-15 heteroatoms, most preferably not more than up to 20 carbons and 0-10 heteroatoms, for example 2 to 10 carbons and 0 to 5 heteroatoms. Of course, the linker may be absent.

According to an embodiment, the linker moiety comprises one or a combination of two or more of the same or different moieties of formulae (20) to (38) below:

(20)

(21)

(22)

(23)

(24)

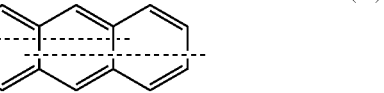
(25)

(26)

(27)

(28)

(29)

(30)

-continued

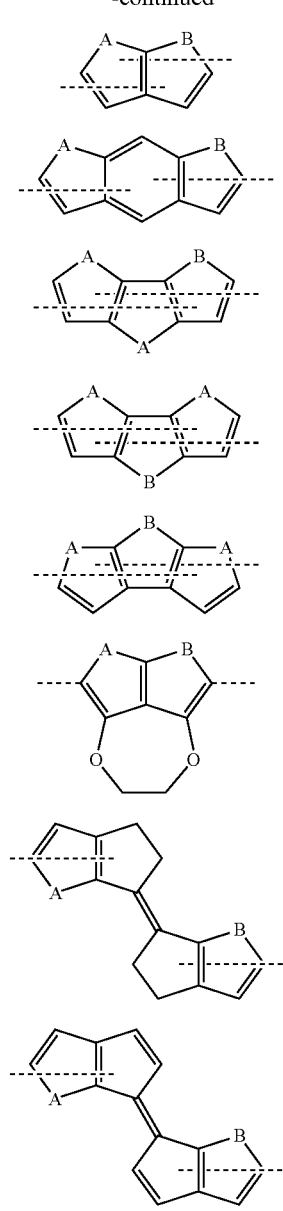

wherein,
the dotted lines indicate single bonds connecting the linker moiety to other structures, such as, preferably, to moieties or substituents independently selected from the core structure, to a further linker moiety of the same structure, to a linker moiety of a different structure, to any one substituent as specified elsewhere, in particular donor and acceptor substituents, and to an anchoring group as defined elsewhere in this specification;
wherein A and B may, independently, be the same or different and may be selected from O, S, Se, $NR_{40}$, $CR_{41}R_{42}$, and $SiR_{41}R_{42}$;
wherein any available/substitutable H on any one of said moieties (20) to (38) may independently be substituted by a C1 to C20 hydrocarbon comprising 0 to 15 heteroatoms, —OH, —SH, —$NH_2$ and halogen;
wherein $R_{41}$ and $R_{42}$ are selected independently from H, and from C1 to C20 hydrocarbons comprising 0 to 15 heteroatoms, wherein $R_{41}$ may also be selected from —OH, —SH,
and —$NH_2$, and wherein $R_{41}$ and $R_{42}$, if both are different from H, —OH, —SH, and —$NH_2$, may be connected to each other to form a ring or ring system;
wherein $R_{40}$ is selected from H and from substituted and unsubstituted C1-C20 alkyl, C2-C20 alkenyl, C2-$C_{20}$ alkynyl, and $C_4$-$C_{20}$ aryl as defined below with respect to $R_{41}$ and $R_{42}$;
wherein two substituents on neighbouring carbon atoms on any one of said moieties (20) to (38) (for example alkyls, alkenyls, —O-alkyls, etc. as defined below) may be connected with each other so as to form a ring or ring system that is fused to the respective moiety.

Said C1 to C20 hydrocarbons comprising 0 to 15 heteroatoms substituting one or more of said moieties (20) to (38) and of $R_{41}$ and $R_{42}$ may preferably be independently selected from substituted or unsubstituted C1-C20 alkyl, C2-C20 alkenyl, C2-C20 alkynyl, C4-C20 aryl, —O—$R_{50}$, S—$R_{50}$, —$NR_{50}R_{51}$, wherein any $R_{50}$ and $R_{51}$ are independently selected from substituted or unsubstituted C1-C20 alkyl, C2-C20 alkenyl, C2-C20 alkynyl and C4-C20 aryl as defined above, wherein $R_{51}$ may further be H, and wherein $R_{50}$ and $R_{51}$, if they are both different from H, may be connected to each other to form an N-containing heteroring; wherein, if any one of said C1-C20 alkyl, C1-C20 alkenyl, C2-C20 alkynyl, C4-C20 aryl, $R_{50}$ and $R_{51}$ are substituted, these substituents, may, independently, be selected from further substituted or unsubstituted C1-C15 alkyl, C2-C15 alkenyl, C2-C15 alkynyl C2-C15 alkynyl, C4-C15 aryl, —OH, —SH, —$NH_2$, O—$R_{52}$, S—$R_{52}$, and —$NR_{52}R_{53}$, wherein $R_{52}$ and $R_{53}$ are independently selected from further substituted or unsubstituted C1-C15 alkyl, C2-C15 alkenyl, C2-C15 alkynyl C2-C15 alkynyl, C4 to C15 aryl, wherein $R_{53}$ may also be H, and wherein $R_{52}$ and $R_{53}$, if they are both different from H, may be connected to each other to form an N-containing heteroring;
wherein if any one of said C1-C15 alkyl, C2-C15 alkenyl, C2-C15 alkynyl C2-C15 alkynyl, C4-C15 aryl, $R_{52}$ and $R_{53}$ is still further substituted, the further substituents, if present, may be selected from substituted or unsubstituted C1-C8 alkyl, C2-C8 alkenyl, C2-C8 alkynyl, C5-C8 aryl, —OH, —SH, and —$NH_2$, O—$R_{54}$, S—$R_{54}$, and —$NR_{54}R_{55}$, wherein $R_{54}$ and $R_{55}$, are independently selected from C1-C8 alkyl, C2-C8 alkenyl, C2-C8 alkynyl, C5 to C8 aryl, wherein $R_{55}$ may also be H.

Preferably, said substituted or unsubstituted C1-C20 alkyl, C2-C20 alkenyl, C2-C20 alkynyl, C4-C20 aryl referred to in the paragraph above is a C1-C15 alkyl, C2-C15 alkenyl, C2-C15 alkynyl, C4-C15 aryl, more preferably a C1-C8 alkyl, C2-C8 alkenyl, C2-C8 alkynyl, C4-C8 aryl, respectively.

Preferably, said further substituted or unsubstituted C1-C15 alkyl, C2-C15 alkenyl, C2-C15 alkynyl, C4-C15 aryl substituent referred to above are C1-C8 alkyl, C2-C8 alkenyl, C2-C8 alkynyl, C4-C8 aryl, more preferably C1-C5 alkyl, C2-C5 alkenyl, C2-C5 alkynyl, C4-C6 aryl and most preferably C1-C4 alkyl, C2-C4 alkenyl, C2-C4 alkynyl, C4-C6 aryl, respectively.

Preferably, said C1-C8 alkyl, C2-C8 alkenyl, C2-C8 alkynyl, C4-C8 aryl further substituents referred to above are C105 alkyl, C2-C5 alkenyl, C2-C5 alkynyl, C4-C6 aryl, more preferably C1-C4 alkyl, C2-C4 alkenyl, C2-C4 alkynyl, C4-C6 aryl and most preferably C1-C3 alkyl, C2-C3 alkenyl, C2-C3 alkynyl, C4-C6 aryl, respectively.

If an aryl in this specification is a C4 or a C5 aryl, it is a heteroaryl comprising the adequate number of ring heteroatoms (preferably selected from O, S and N) to form said C4-C5 aryl.

Any alkyl, alkenyl or alkynyl referred to in this specification may be selected, independently, from linear and, if the adequate number of carbons is present (in particular at least 3 carbons), from branched and/or cyclic alkyls, alkenyls and alkynyls. For example, said alkyl, alkenyl or alkynyl may, independently, be cyclic and branched.

Any alkenyl and alkynyl substituent may comprise a double and/or triple bond anywhere in the chain, for example towards the end of the chain. Double and triple bonds satiated at any position, preferably distal from the attachment of the substituent, may be used in polymerization reactions involving two double/triple bonds, for example olefin metathesis, catalyzed by metal atoms such as ruthenium. In this way, dye molecules may be connected via their alkene/alkyne bonds once adsorbed on the semiconductor surface of the electrochemical device, for example. In this way, the semiconductor surface may be better sheltered from the redox couple in the charge transport layer (electrolyte).

It is noted that in case said linker is part of an acceptor substituent, it may be substituted at any available position by an acceptor substituent as specified elsewhere in this specification, in —CN, —CF$_3$, —F, —Cl, —Br, —I, —NO$_2$, an amide moiety, —COOH, —COOR$_{29}$, —C(O)R$_{29}$, —C(O))H, and from the moieties of formulae (XXX) to (XXXVIII) and substituents of formulae (XL) to (XLIV) as defined elsewhere in this specification. These substituents may also be present on any part (e.g. alkyl, alkenyl alkynyl and aryl) of said C1 to C20 hydrocarbon comprising 0 to 15 heteroatoms as defined above.

In case said linker is part of a donor substituent, it may be substituted at any available position by a donor substituent as specified elsewhere in this specification, in particular by a substituent of formulae (XVIII), (XX), (XXI) and (XXII) as defined elsewhere in this specification. These substituents may also be present on any part (e.g. alkyl, alkenyl alkynyl and aryl) of said C1 to C20 hydrocarbon comprising 0 to 15 heteroatoms as defined above.

According to an embodiment, said C1 to C20 hydrocarbons comprising 0 to 15 heteroatoms is a C1 to C15 hydrocarbon comprising 1 to 10 heteroatoms. Preferably, it is a C1 to C8 hydrocarbon comprising 0 to 5 heteroatoms and most preferably a C1 to C5 hydrocarbon comprising 0 to 3 heteroatoms.

According to a preferred embodiment, the compound of the invention comprises one or more donor substituent, one or more acceptor substituent, or a combination of one or more donor and one or more acceptor substituents.

The donor and/or acceptor substituents are connected to said core structure, preferably in a π-conducting manner, optionally by way of a linker.

According to an embodiment, said 16 π-electron ring system (core structure) comprises at least one donor substituent that comprises an electron donating (a donor) group, such that said donor substituent is capable of transferring an electron to said ring system. Preferably, the core structure comprises two or more donor substituents.

According to another embodiment, said 16 π-electron ring system (core structure) lacks a donor substituent. It is noted that the core structure, for example U-1, is already electron rich. Although the presence of one or more donor substituents is preferred, it is encompassed by the present invention that a donor substituent as defined herein is absent in the compounds of the invention.

According to an embodiment, said 16 π-electron ring system (core structure) comprises at least one acceptor substituent that comprises an electron accepting group, such that said acceptor substituent can take up an electron from said ring system.

Basically, a donor substituent is a substituent comprising a donor group or function in a π-conjugated connection with the core structure. A donor group or function is a group that has an electron pushing character, a region of high electron density and/or an electron rich group, so that the group is capable of giving an electron away, thereby becoming less electron rich, increasing the electron density on the conjugated linker and/or, finally, on the core structure.

Generally, a structure comprising a donor group is characterized in that it generally exhibits resonance or mesomerism and may be drawn by way of delocalized electrons, which generally leave behind a positive charge on the group, when the electron is given away to the conjugated π linker or core structure. The donor has thus a tendency to give an electron away and to accommodate a positive charge, in particular if connected in a π-conjugated manner to an acceptor group, or any other electron drawing or pulling function or structure.

This is illustrated by the scheme 1 below, showing the pyrrol in the form of a substituent, a typical example of a donor group/function, in which the mesomer shown on the left is a donor having high electron density, and the mesomer shown on the right has delocalized electrons, so that an electron has been transferred to the dotted line (left structure), which represents the connection to a π-conjugated system or linker.

Scheme 1

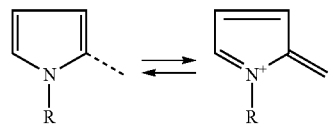

On the other hand, an acceptor substituent is a substituent comprising an acceptor group or function in a π-conjugated connection with the core structure. An acceptor group or function is a group that has an electron pulling character, a region of low electron density and/or an electron poor group, so that the group is capable of taking an electron up, thereby becoming less electron poor, reducing the electron density on the conjugated linker and/or, finally, on the core structure.

A structure comprising an acceptor group is characterized in that it generally exhibits resonance or mesomerism and may be drawn by way of delocalized electrons, which generally leave behind negative charge on the group, when the electron is taken away from a conjugated π linker or core structure. The acceptor has thus a tendency to take an electron away and to accommodate a negative charge, in particular if connected in a π-conjugated manner to a donor, or any other electron pushing function or structure.

This is illustrated in scheme 2 below, showing a pyridine substituent, a typical example of an acceptor group/function, in which the mesomer shown on the left is an acceptor having low electron density, and the mesomer shown on the right has delocalized electrons, so that a ring electron has been transferred to the nitrogen atom, leaving a positive charge on the ring carbon connected via a linker (dotted line) to a π-conjugated linker or to the core structure. In the mesomer shown on the right, an electron should subsequently be drawn from the π-conjugated system/core structure, so as to compensate the positive charge on the carbon atom. The pyridinyl substituent has thus an electron pulling effect and is an electron acceptor.

Scheme 2

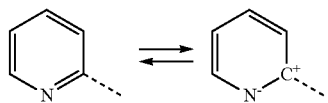

As a further example, the mesomers of —CN, a typical acceptor, are shown in scheme 3 below, connected in a π-conjugated manner to phenylene moiety, which may function as a linker.

Scheme 3

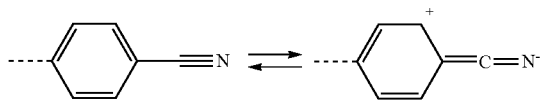

As in scheme 2, the positively charged carbon in scheme 3 will be compensated by an electron stemming from the π-conjugated system to which the acceptor is connected, for example from the core structure.

From the above it is clear that many different structures may fulfil the donor/acceptor functions and the present invention does not wish to be understood to be limited to any particular structure. Any limitation to a specific donor or acceptor substituent or structure would be an undue limitation of the present invention. The skilled person is capable of selecting donor and/or acceptor substituents from an almost indefinite pool of possibilities.

Further below, it is detailed how oxidation potential E(S+/S) and the exited state oxidation potential E(S+/S*) can be used for determining if any specific substituent, when present on the core structure, is a donor or an acceptor substituent, or if it does have neither donor nor acceptor properties.

For exemplary purposes, structural definitions with respect to some commonly used donors and then acceptor substituents are given below, which can also be regarded as embodiments of the present invention.

In general terms, a donor substituent is any substituted or unsubstituted aromatic ring or conjugated π system, including rings and ring systems comprising heteroatoms, as well as any directly to the core structure attached nitrogen, oxygen, or sulphur atom, provided that it does not contain a typical acceptor group or function as defined above, in particular not a strong acceptor group or function.

More specifically, a donor substituent is any substituted or unsubstituted aromatic ring, including heteroaryls, or other type of conjugated π system, comprising, optionally, substituents selected from $-OR_8$, $-SR_8$, $-SeR_8$, $-NR_8R_9$, wherein $R_8$ and $R_9$ are independently selected from H and from C1 to C40 hydrocarbons comprising 0 to 20 heteroatoms. It is noted that any one of $R_8$ and $R_9$ may be connected to the aromatic ring system or (more generally) to the conjugated π system to form a ring fused to said aromatic ring or π system.

In case of direct heteroatom substitution (the donor being connected to the core structure via a heteroatom), the donor may be selected from $-OR_8$, $-SR_8$, $-SeR_8$, $-NR_8R_9$, wherein $R_8$ and $R_9$ are independently as defined above. Preferably, $R_8$ and $R_9$ do not in particular not comprise an acceptor group or function as specified elsewhere in this specification.

Preferably, said C1 to C40 hydrocarbons comprising 0 to 20 heteroatoms of $R_8$ and $R_9$ are C1 to C30 hydrocarbons comprising 0 to 15 heteroatoms, more preferably, C1 to C20 hydrocarbons comprising 0 to 10 heteroatoms, even more preferably C1 to C10 hydrocarbons comprising 0 to 5 heteroatoms and most preferably C1 to C5 hydrocarbons comprising 0 to 3 heteroatoms.

According to a preferred embodiment, $R_8$ and $R_9$ are selected independently from H and from substituted or unsubstituted C1-C40 alkyl, C2-C40 alkenyl, C2-C40 alkynyl, C4-C40 aryl, $-O-R_{70}$, $S-R_{70}$, $-NR_{70}R_{71}$, wherein any $R_{70}$ and $R_{71}$ are independently selected from substituted or unsubstituted C1-C40 alkyl, C2-C40 alkenyl, C2-C40 alkynyl, and C4-C40 aryl as defined above, and wherein $R_{51}$ may further be H;

wherein, if any one of said C1-C40 alkyl, C2-C40 alkenyl, C2-C40 alkynyl, C4-C40 aryl, $R_{50}$ and $R_{51}$ are substituted, these substituents, may, independently, be selected from further substituted or unsubstituted C1-C20 alkyl, C2-C20 alkenyl, C2-C20 alkynyl, C4-C20 aryl, —OH, —SH, —NH$_2$, $O-R_{72}$, $S-R_{72}$, $-NR_{72}R_{73}$, wherein $R_{72}$ and $R_{73}$ are independently selected from further substituted or unsubstituted C1-C20 alkyl, C2-C20 alkenyl, C2-C20 alkynyl, C4-C20 aryl, wherein $R_{53}$ may also be H;

wherein if any one of said C1-C20 alkyl, C2-C20 alkenyl, C2-C20 alkynyl, and C4-C20 aryl, $R_{52}$ and $R_{53}$ is still further substituted, the further substituents, if present, may be selected from substituted or unsubstituted C1-C15 alkyl, C2-C15 alkenyl, C2-C15 alkynyl, C4-C15 aryl, —OH, —SH, and —NH$_2$, $O-R_{74}$, $S-R_{74}$, $-NR_{74}R_{75}$, wherein $R_{74}$ and $R_{75}$, are independently selected from C1-C15 alkyl, C2-C15 alkenyl, C2-C15 alkynyl, C5 to C15 aryl, wherein $R_{75}$ may also be H.

Preferably, said substituted or unsubstituted C1-C40 alkyl, C2-C40 alkenyl, C2-C40 alkynyl, C4-C40 aryl referred to in the paragraph above is a C1-C30 alkyl, C2-C30 alkenyl, C2-C30 alkynyl, C4-C30 aryl, more preferably a C1-C20 alkyl, C2-C20 alkenyl, C2-C20 alkynyl, C4-C20 aryl, even more preferably a C1-C15 alkyl, C2-C15 alkenyl, C2-C15 alkynyl, C4-C15 aryl, and most preferably a C1-C10 alkyl, C2-C10 alkenyl, C2-C10 alkynyl, C4-C10 aryl, respectively.

Preferably, said further substituted or unsubstituted C1-C20 alkyl, C2-C20 alkenyl, C2-C20 alkynyl, C4-C20 aryl substituent referred to above are C1-C15 alkyl, C2-C15 alkenyl, C2-C15 alkynyl, C4-C15 aryl, more preferably C1-C10 alkyl, C2-C10 alkenyl, C2-C10 alkynyl, C4-C10 aryl and most preferably C1-C6 alkyl, C2-C6 alkenyl, C2-C6 alkynyl, C4-C6 aryl, respectively.

Preferably, said C1-C15 alkyl, C2-C15 alkenyl, C2-C15 alkynyl, C4-C15 aryl further substituents referred to above are C1-C10 alkyl, C2-C10 alkenyl, C2-C10 alkynyl, C4-C10 aryl, more preferably C1-C8 alkyl, C2-C8 alkenyl, C2-C8 alkynyl, C4-C8 aryl and most preferably C1-C4 alkyl, C2-C4 alkenyl, C2-C4 alkynyl, C4-C6 aryl, respectively.

According to an embodiment of the compound of the invention and of the device comprising the compound, one or more of said substituents $R^1$ to $R^9$, in as far as present, is independently selected from substituents of formula (XVIII) below ("exemplary donor substituents"):

(XVIII)

wherein U is, independently of n, selected from ≡(ethynylene) and from an ethylene moiety of formula (XIX) below:

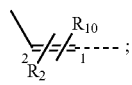 (XIX)

wherein n is selected from 0, and from integers 1 to 10, preferably 1, 2 and 3;
wherein the dotted line in formula (XVIII) and (XIX) represents a single bond to one of the peripheral atoms of the 16 π-electron ring system, or a to linker moiety connecting said substituent of formula (XVIII) to said ring system in a π-conjugated manner;
$R_1$ is selected from a moiety of formula (XX), (XXI) and (XXII) below:

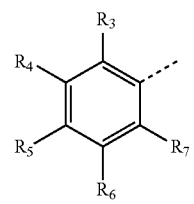 (XX)

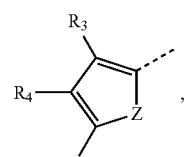 (XXI)

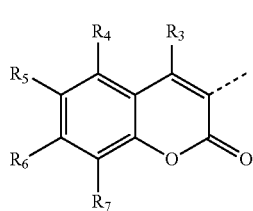 (XXII)

and further from —$OR_8$, —$SR_8$, —$SeR_8$, —$NR_8R_9$, wherein $R_8$ and $R_9$ are independently selected from H and from C1 to C40 hydrocarbons comprising 0 to 20 heteroatoms, preferably as further defined above;
wherein the dotted line in the structure of formulae (XX) to (XXII) represents a single bond by which substituent $R_1$ is connected to the respective carbon of moiety U, or, if n is 0, to one of the peripheral atoms of the 16 π-electron ring system, or a to a π-conducting linker moiety connecting said substituent of formula (XVIII) to said ring system;
wherein Z is selected from O, S, Se, $NR_8$, $SiR_8R_9$;
wherein $R_3$, $R_4$, $R_5$, $R_6$, $R_7$, in as far as present, are independently selected from H, $R_8$, $R_9$, —$OR_8$, —$SR_8$, —$SeR_8$, —$NR_8R_9$, wherein any one of $R_3$ to $R_7$ may be connected to another one of substituents $R_3$ to $R_7$ so as to form a ring or ring system fused to said moiety of formula (XX), (XXI) or (XXII), respectively, and, if any one of $R_3$, $R_4$, $R_5$, $R_6$, and $R_7$, is selected from —$OR_8$, —$SR_8$, —$SeR_8$, —$NR_8R_9$, said $R_8$ and/or $R_9$ may, if it is not H, independently be connected with any other one of $R_3$ to $R_7$ so as to form a ring or ring system fused to said moiety of formulae (XX), (XXI) or (XXII), respectively, and wherein, if any one of $R_3$, $R_4$, $R_5$, $R_6$, and $R_7$, is selected from —$NR_8R_9$, said $R_8$ and $R_9$ may be connected to each other so that the respective substituent of $R_3$ to $R_7$ is an N-containing heteroring or ring system bound to said moiety of formulae (XX), (XXI) or (XXII), respectively;
wherein $R_2$ and $R_{10}$ are independently selected from H and substituents as defined for $R_1$.

Preferred, more preferred and most preferred embodiments of $R_8$ and $R_9$ with respect to (XX), (XXI) or (XXII) are as defined above with respect to donor substituents in general.

Figures 1, 5:
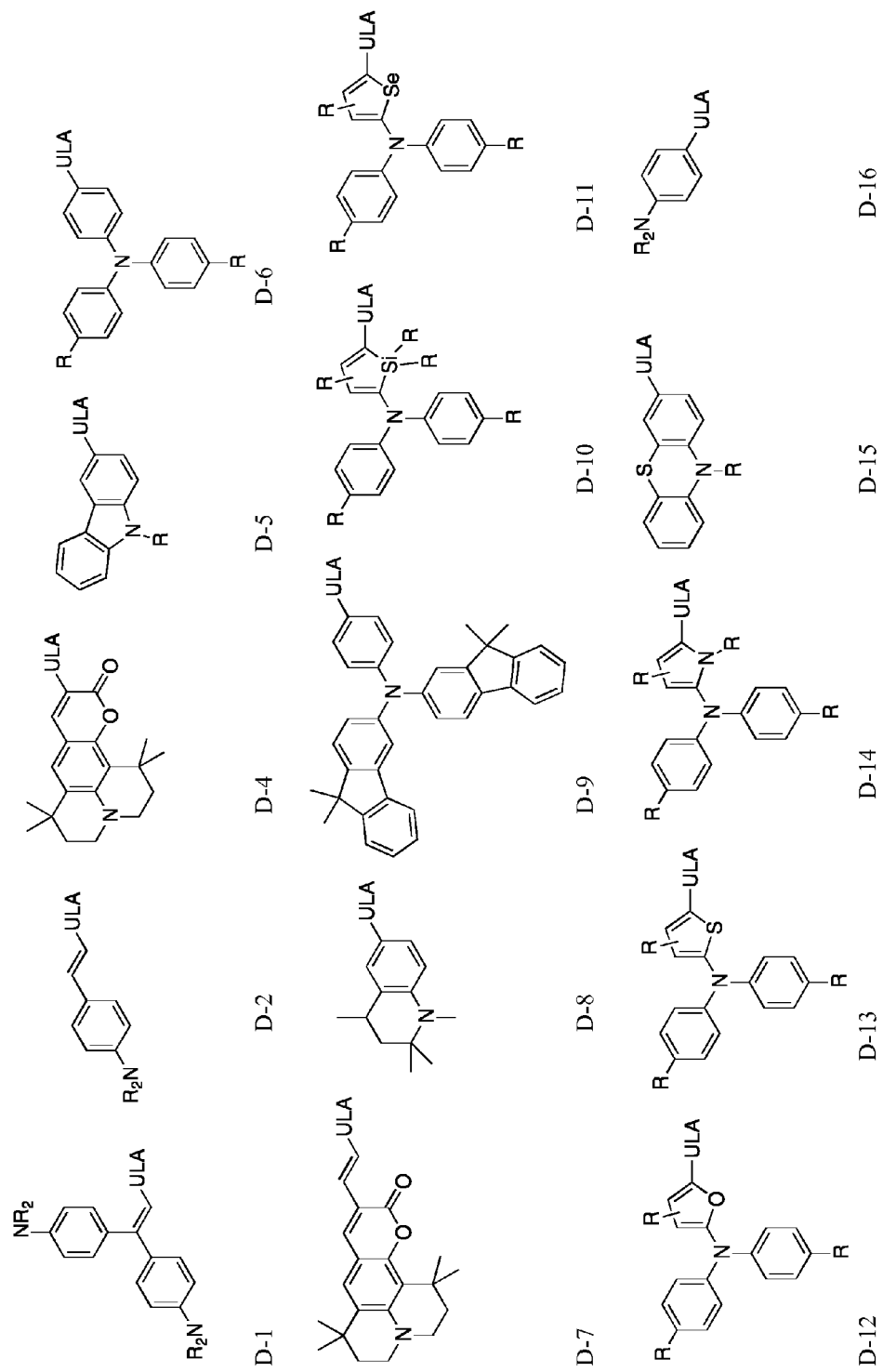
In FIGS. 5 and 6, "ULA" refers to any one of these cores structures, or to those of shown in FIG. 4.
Figures 2, 5:
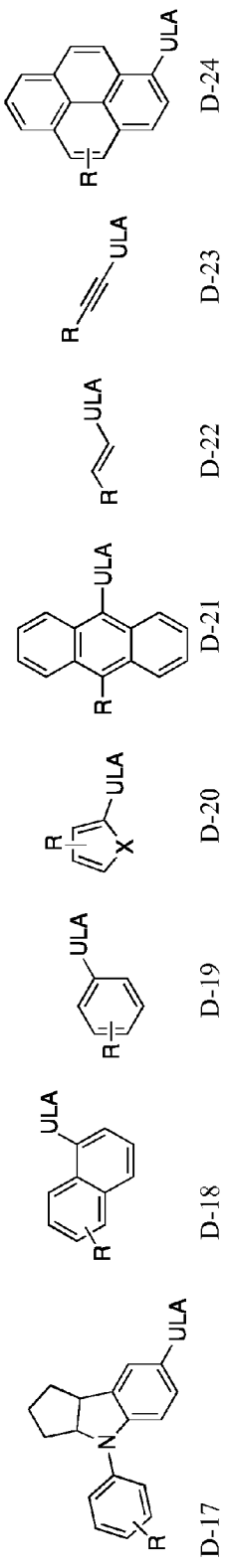

Exemplary donor substituents D-1 to D-24 are provided in FIG. 5. In these substituents, ULA represents any one of the core structures, which may be selected, for example, from any one of U-1 to U-44 shown in FIGS. 3 and 4.

The substituents R in several of the donor substituents in FIG. 5 are preferably selected, independently, from H, and from substituents $R_8$ and $R_9$, and if bound to a carbon, also from $OR_8$, $SR_8$, $SeR_8$, and $NR_8R_9$ as defined in this specification. If a substituent of FIG. 5 has two or more R (D-1, D-2, D-6, etc.), each R may be the same or different.

Preferred substituents for $R_8$ and $R_9$ are H, C1-C40 alkyl, C2-C40 alkenyl, C2-C40 alkynyl, C4-C40 aryl, —O—$R_{70}$, S—$R_{70}$, —$NR_{70}R_{71}$ as defined elsewhere in this specification, in particular with respect to donor substituents as defined above.

According to an embodiment, one or more of said substituents $R^1$ to $R^9$, in as far as present, is and/or comprises an acceptor substituent. According to an embodiment, said acceptor substituent comprises a substituent or moiety selected from —CN, —$CF_3$, —F, —Cl, —I, —Br, —$NO_2$, an amide moiety, —COOH, —$COOR_{29}$, —$C(O)R_{29}$, —C(O))H, from the moieties of formulae (XXX) to (XXXVIII) below, and from C1-C40 hydrocarbons comprising 1 to 20 heteroatoms, said hydrocarbon comprising one or a combination of several of the aforementioned moieties and/or substituents.

According to a preferred embodiment one or more of said substituents $R^1$ to $R^9$, in as far as present, comprises a substituent or moiety selected from —CN, —$CF_3$, —F, —Cl, —I, —Br, —$NO_2$, an amide moiety, —COOH, —$COOR_{29}$, —$C(O)R_{29}$, —C(O))H, and from the moieties of formulae (XXX) to (XXXVIII) below:

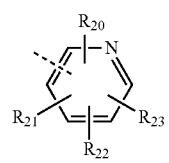 (XXX)

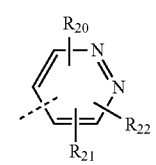 (XXXI)

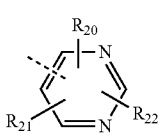 (XXXII)

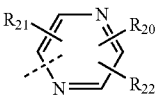 (XXXIII)

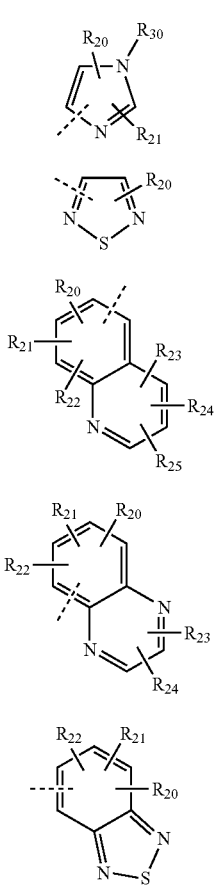

(XXXIV)

(XXXV)

(XXXVI)

(XXXVII)

(XXXVIII)

wherein the dotted line in the structures (substituents) of formulae (XXX) to (XXXVIII), and also of formulae (XL) to (XLIV) below, represents a single bond connecting said structure (substituent) to one of the peripheral atoms of the 16 π-electron ring system, or to a π-conducting linker moiety connecting said structure (substituent), in particular in a π-conducting manner, to said ring system;

wherein $R_{29}$ is a C1 to C40 hydrocarbon comprising 0 to 20 heteroatoms;

wherein $R_{20}$ to $R_{25}$, in as far as present, are independently selected from H, from C1 to C40 hydrocarbons comprising 0 to 20 heteroatoms, from —F, —Cl, —I, —Br, —NO₂, —OH, —SH, and —NH₂;

wherein substituents on neighbouring atoms and/or substituents on atoms that are separated by one or more atoms on one of said moieties (XXX) to (XXXVIII) and/or (XL) to (XLIV) (below), may be connected to each other to form a ring fused to any one of said moieties (XXX) to (XXXVIII) and/or (XL) to (XLIV) below, respectively.

According to an embodiment, any one of $R_{20}$ to $R_{25}$ may in particular be independently selected from C1 to C40 hydrocarbons comprising 0 to 20 heteroatoms, said hydrocarbons comprising or consisting of —CN, —CF₃, —COOH, —COOR₂₉, —C(O)R₂₉, —C(O))H, optionally connected to the structure of formulae (XXX) to (XXXVIII) and (XL) to (XLIV) by way of a π-conjugated linker.

According to an embodiment, any one of $R_{20}$ to $R_{25}$ may in particular and/or further be selected from anchoring groups, in particular anchoring groups as defined elsewhere in this specification, or from C1 to C40 hydrocarbons comprising 0 to 20 heteroatoms, said hydrocarbon comprising an anchoring group. Independently, any one of $R_{30}$ and $R_{31}$ ($R_{31}$ see below) may be selected from anchoring groups, in particular anchoring groups as defined elsewhere in this specification, or from C1 to C40 hydrocarbons comprising 0 to 20 heteroatoms, said hydrocarbon comprising an anchoring group.

According to an embodiment, said amide moiety may in particular be selected from moieties of formulae (XL) to (XLIV) below:

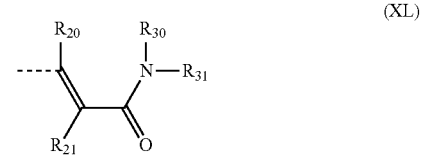

(XL)

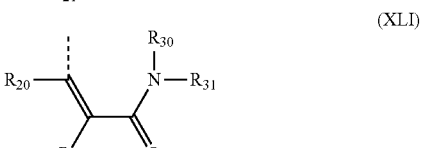

(XLI)

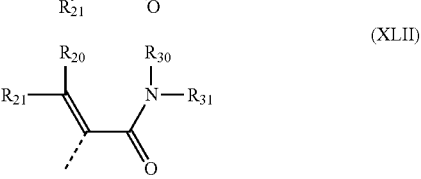

(XLII)

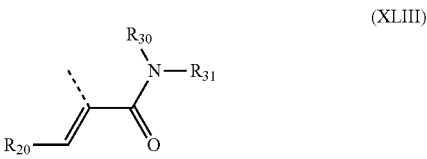

(XLIII)

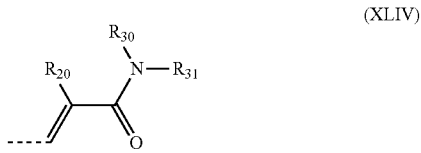

(XLIV)

wherein $R_{30}$ and $R_{31}$ are independently selected from H and from C1 to C40 hydrocarbons comprising 0 to 20 heteroatoms, including such hydrocarbons comprising an anchoring group.

Preferably, said C1 to C40 hydrocarbons comprising 0 to 20 heteroatoms is connected via a carbon atom to said nitrogen atom carrying said substituents $R_{30}$ and $R_{31}$ in said structure of formulae (XXXIV) and (XL) to (XLIV) or to said oxygen atom in said substituent $R_{29}$ in COOR₂₉, and —C(O)R₂₉.

According to an embodiment, said C1 to C40 hydrocarbons comprising 0 to 20 heteroatoms and said C0 to C40 hydrocarbons comprising 1 to 20 heteroatoms of said acceptor substituent or part of said acceptor substituent (which is one or more selected from $R^1$ to $R^9$), are C1 to C30 hydrocarbons comprising 1 to 15 heteroatoms, preferably C1 to C20 hydrocarbons comprising 1 to 10 heteroatoms, and most preferably C1 to C10 hydrocarbons comprising 1 to 5 heteroatoms, for example C1 to C5 hydrocarbons comprising 1 to 3 heteroatoms.

The structure formulae A-3, A-8 and A-9 in FIG. 6 are specific embodiments of amide moieties according to formulae (XL) to (XLIV) above.

According to an embodiment, in said moiety of formulae (XLIV), substituents $R_{20}$ and $R_{30}$ are connected to each other so as to form a ring of said moiety, by way of moiety (L) below:

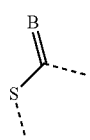

(L)

wherein the dotted line connected to the sulphur atom in the structure of formula (L) represents the single bond of (or to) $R_{20}$ in the structure of formula (XLIV) and wherein the dotted line connected the carbon atom in the structure of formula (L) represents the single bond of (or to) $R_{30}$ in the structure of formula (XLIV), so that the structures of formulae (XLIV) and (L) form a S and N-containing, five-membered heteroring;

wherein B is selected from O, S, $SiR_{27}R_{28}$ and $CR_{27}R_{28}$, wherein $R_{27}$ and $R_{28}$ are independently selected from H and from C0 to C20 hydrocarbons comprising 0 to 15 heteroatoms, and wherein $R_{27}$ and $R_{28}$ may be connected to each other so as to form a substituted or unsubstituted ring.

According to a preferred embodiment, $R_{27}$ and $R_{28}$ are independently selected from —CN, —$CF_3$, —F, —Cl, —I, —Br, —$NO_2$, —$COOR_{56}$, —$C(O)R_{60}$ (—$C(=O)R_{60}$ ketone), —C(O))H(—C(=O)H aldehyde), substituted and unsubstituted C1-C15 alkyl, C2-C15 alkenyl, C2-C15 alkynyl, C4-C15 aryl, —O—$R_{56}$, —S—$R_{56}$, —$NR_{56}R_{57}$, wherein $R_{56}$, $R_{57}$ and $R_{60}$ are selected, independently, from H, substituted and unsubstituted C1-C15 alkyl, C2-C15 alkenyl, C2-C15 alkynyl, C4-C15 aryl, wherein $R_{60}$ is further selected from —$NR_{58}R_{59}$, and wherein $R_{27}$ and $R_{28}$, together, may also form a =O (oxo) or =S (thioxo) substituent/group;

wherein, if said C1-C15 alkyl, C2-C15 alkenyl, C2-C15 alkynyl, C4-C15 aryl is/are substituted, these substituents, may, independently, be selected from —CN, —$CF_3$, —F, —Cl, —I, —$NO_2$, —$COOR_{58}$, —$C(O)R_{58}$, —C(O))H, =O (oxo), =S (thioxo), further substituted or unsubstituted C1-C10 alkyl, C2-C10 alkenyl, C2-C10 alkynyl, C4-C10 aryl, O—$R_{58}$, S—$R_{58}$, —$NR_{58}R_{59}$, wherein $R_{58}$ and $R_{59}$ are independently selected from H and from substituted and unsubstituted C1-C8 alkyl, C2-C8 alkenyl, C2-C8 alkynyl, and C4-C8 aryl, wherein substituents of the latter may be selected from —CN, —$CF_3$, —F, —Cl, —I, —Br, —$NO_2$, —OH, —SH, =O, =S, and —$NH_2$.

If one compares the acceptor substituents A-8 and A-9 in FIG. 6 with the amide substituent of structure (XLIV), one can see that A-8 and A-9 are encompassed by (XLIV), in that $R_{20}$ and $R_{30}$ are connected with each other by a —S—CS— bridge (A-8) or an —S—CR-bridge, wherein R is here a further substituted, heterocyclic cyclo-aza-thia-pentylidene (A-9). The structure formula A-8 and A-9 in FIG. 6 represent thus particular embodiments of compound comprising the acceptor substituent (XLIV) with $R_{20}$ and $R_{30}$ being connected as illustrated in moiety (L).

According to an embodiment, said moiety of formulae (XL) and (XLII), substituents $R_{20}$ and $R_{30}$ are connected to each other so as to form a ring of said moiety according to moiety (LI) below:

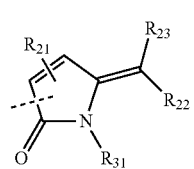

(LI)

wherein $R_{21}$, $R_{22}$, $R_{23}$ and $R_{31}$ are, independently, as defined above and elsewhere in this specification.

The structure formula A-3 in FIG. 6 represents particular embodiments of compound comprising the acceptor substituent (LI) above.

A preferred acceptor substituent is the substituent of formula (LII) below:

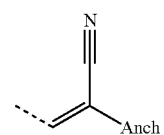

(LII)

wherein Anch may be any anchoring group as defined elsewhere in this specification, preferably COOH and COO⁻. The dotted line representing the connection to the π-conjugated system or core structure may be in cis or trans position.

It is noted that the substituents —CN, —$CF_3$, —F, —Cl, —Br, —I, —$NO_2$, amide moieties, in particular as defined in this specification, —COOH, —$COOR_{29}$, —$C(O)R_{29}$, —C(O))H as well as the moieties (XXX) to (XXXVIII) have acceptor properties, which are obtained if these substituents are connected in any π-conjugated manner, optionally via a linker as defined elsewhere in this specification, to the core structure. Substituents —CN, —$CF_3$—F and —$NO_2$, and said amides are particularly strong acceptor groups, which may turn a substituent into an acceptor substituent.

Therefore, the donor substituents as defined elsewhere in this specification are preferably characterized in that any acceptor group or moiety having acceptor properties as specified herein, in particular any strong acceptor group selected from —CN, —$CF_3$, —F and —$NO_2$ is absent. It is noted that strong acceptor groups may turn a substituent comprising a donor function as defined above into an overall acceptor substituent, such as acceptors A-11 to A-14 from FIG. 6. For this reason, there is a lot of structural diversity possible with respect to substituents $R_{20}$ to $R_{25}$ and $R_{29}$ to $R_{31}$. More specifically, an acceptor substituent may comprise a donor substituent as defined herein, which is substituted by an acceptor substituent as defined herein, wherein said substituents are connected in a π-conjugated manner.

As mentioned elsewhere in this specification, any one of $R_{20}$, $R_{21}$, $R_{22}$, $R_{23}$, $R_{24}$, $R_{25}$, $R_{29}$, $R_{30}$, and $R_{31}$ may be independently selected from C1 to C40 hydrocarbons comprising 0 to 20 heteroatoms. Said hydrocarbons may in particular be independently selected from substituted or unsubstituted C1-C40 alkyl, C2-C40 alkenyl, C2-C40 alkynyl, C4-C40 aryl, wherein $R_{29}$ in —$C(O)R_{29}$ may further be selected from —$NR_{82}R_{83}$ as defined below;

wherein, if any one of said C1-C40 alkyl, C2-C40 alkenyl, C2-C40 alkynyl, C4-C40 aryl, $R_{80}$ and $R_{81}$ (see below for $R_{80}$ and $R_{81}$) are substituted, these substituents, may, independently, be selected from —CN, —$CF_3$, —F, —Cl, —Br, —I, —$NO_2$, —COOH, —$COOR_{82}$, —$C(O)R_{82}$, —C(O))H, =O (oxo), =S (thioxo), further substituted or unsubstituted C1-C20 alkyl, C2-C20 alkenyl, C2-C20 alkynyl, C4-C20 aryl, —OH, —SH, —$NH_2$, O—$R_{82}$, S—$R_{82}$, —$NR_{82}R_{83}$, wherein $R_{82}$ and $R_{83}$ are independently selected from further substituted or unsubstituted C1-C20 alkyl, C2-C20 alkenyl, C2-C20 alkynyl, C4-C20 aryl, wherein $R_{83}$ may also be H;

wherein if any one of said C1-C20 alkyl, C2-C20 alkenyl, C2-C20 alkynyl, C4-C20 aryl, $R_{82}$ and $R_{83}$ is still further substituted, the further substituents, if present, may be selected from —CN, —CF₃, —F, —Cl, —Br, —I, —NO₂, —COOH, —COOR$_{84}$, —C(O)R$_{84}$, —C(O))H, =O (oxo), =S (thioxo), substituted or unsubstituted C1-C15 alkyl, C2-C15 alkenyl, C2-C15 alkynyl, C4-C15 aryl, —OH, —SH, and —NH₂, O—R$_{84}$, S—R$_{84}$, —NR$_{84}$R$_{85}$, wherein R$_{84}$ and R$_{85}$, are independently selected from C1-C8 alkyl, C2-C8 alkenyl, C2-C8 alkynyl, C5 to C8 aryl, wherein R$_{85}$ may also be H, and wherein R$_{84}$ in —C(O)R$_{84}$ may also be —NR$_{80}$R$_{81}$ as defined below;

wherein any one of R$_{20}$, R$_{21}$, R$_{22}$, R$_{23}$, R$_{24}$, R$_{25}$ may further be selected from —CN, —CF₃, —F, —Cl, —Br, —I, —NO₂, amide moieties, in particular as defined in this specification, —COOH, —COOR$_{29}$, —C(O)R$_{29}$, and —C(O))H, —O—R$_{80}$, S—R$_{80}$, —NR$_{80}$R$_{81}$, wherein any R$_{80}$ and R$_{81}$ are independently selected from substituted or unsubstituted C1-C40 alkyl, C2-C40 alkenyl, C2-C40 alkynyl, C4-C40 aryl as defined above, and wherein R$_{81}$ may further be H, wherein substituents of said C1-C40 alkyl, C2-C40 alkenyl, C2-C40 alkynyl, C4-C40 aryl are as defined above.

Preferably, said substituted or unsubstituted C1-C40 alkyl, C2-C40 alkenyl, C2-C40 alkynyl, C4-C40 aryl referred to in the paragraph above is a C1-C30 alkyl, C2-C30 alkenyl, C2-C30 alkynyl, C4-C30 aryl, more preferably a C1-C20 alkyl, C2-C20 alkenyl, C2-C20 alkynyl, C4-C20 aryl, even more preferably a C1-C15 alkyl, C2-C15 alkenyl, C2-C15 alkynyl, C4-C15 aryl, and most preferably a C1-C10 alkyl, C2-C10 alkenyl, C2-C10 alkynyl, C4-C10 aryl, respectively.

Preferably, said further substituted or unsubstituted C1-C20 alkyl, C2-C20 alkenyl, C2-C20 alkynyl, C4-C20 aryl substituent referred to above are C1-C15 alkyl, C2-C15 alkenyl, C2-C15 alkynyl, C4-C15 aryl, more preferably C1-C10 alkyl, C2-C10 alkenyl, C2-C10 alkynyl, C4-C10 aryl and most preferably C1-C6 alkyl, C2-C6 alkenyl, C2-C6 alkynyl, C4-C6 aryl, respectively.

Preferably, said C1-C15 alkyl, C2-C15 alkenyl, C2-C15 alkynyl, C4-C15 aryl further substituents referred to above are C1-C10 alkyl, C2-C10 alkenyl, C2-C10 alkynyl, C4-C10 aryl, more preferably C1-C8 alkyl, C2-C8 alkenyl, C2-C8 alkynyl, C4-C8 aryl and most preferably C1-C4 alkyl, C2-C4 alkenyl, C2-C4 alkynyl, C4-C6 aryl, respectively.

It is noted that acceptor substituents may be connected to said core structure via a π-conducting linker as defined above or via a donor substituent as defined above. This is illustrated by examples A-11 to A-14 in FIG. 6. In other words, acceptor substituents may be separated from the core structure by donors, other acceptors and linkers.

In the case of an acceptor substituent, said linker connecting the acceptor group and the core structure may be substituted in particular also by acceptor groups, such as one or more selected from —CN, —CF₃, —F, —Cl, —Br, —I, —NO₂, amide moieties, in particular as defined in this specification, —COOH, —COOR$_{29}$, —C(O)R$_{29}$, —C(O))H. An acceptor substituent may also comprise one or more substituents selected from anchoring groups.

In FIG. 6, shows exemplary embodiments of acceptor substituents in accordance with the present invention. ULA is a core structure, which may be selected from any one of U-1 to U-44 in FIGS. 3 and 4. Anch refers to an anchoring group as defined elsewhere in this specification, preferably —COOH or the deprotonated form thereof. W is as defined in the box at the bottom of FIG. 6. In FIG. 6, R refers independently to H or substituted or unsubstituted C1-C40 alkyls as defined elsewhere in this specification, preferably to H or unsubstituted alkyls.

R$_4$ refers to any one selected from CN, CF₃, F, Cl, Br, I, NO₂, COOH, COOR$_{29}$, and C(O)R$_{29}$, C(O))H, or to a π-conducting linker to which one or more of the aforementioned are bound in a π-conducting manner. Z in FIG. 6 is independently as defined elsewhere in this specification, in particular with respect to moieties occurring in donor ligands (O, S, Se, NR$_8$, SiR$_8$R$_9$).

Without wishing to be bound by theory, in the acceptor substituents shown in FIG. 6, substituents A-1, A-2, A-4, A-5, A-6, A-10, and A-11 through A-14 owe their acceptor properties exclusively or to a large extent to the strong acceptor group —CN, possibly in combination with an anchoring group as shown in the box in FIG. 6, and/or to R$_4$, if present, which comprise also a strong acceptor group as defined above, such as CN. The remaining substituent shown in FIG. 6 (A-3, A-7 through A-9, A-15 to A-23) are acceptors by them-selves, meaning that they are also would also be acceptors if the —CN group, if present, were be absent. This does, however, not exclude the possibility that, according to an embodiment of the invention, any R$_4$ may be present on any one of the acceptor substituents A-3, A-7 through A-9, A-15 to A-23.

It is noted that any one of the acceptor substituents shown in FIG. 6 may be further substituted, in particular by substituents as defined with respect to R$_{20}$ to R$_{25}$ and or R$_4$ as defined elsewhere in this specification.

According to an embodiment, the invention encompasses a compound of formulae (LIII) and preferably (LIV) below:

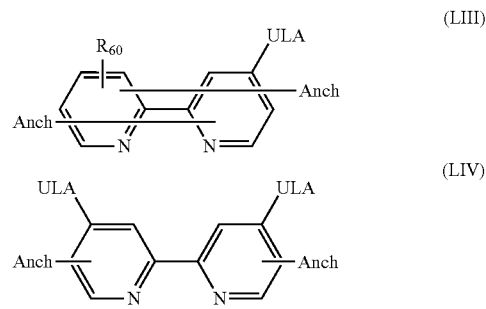

wherein ULA is represents a substituted or unsubstituted core structure as defined in this specification;
Anch represents an anchoring group, wherein, in formulae (LIII) there may only be one anchoring group present, the other substituent Anch being H;
wherein, in (LIII), R$_{60}$ is selected from H, substituted and unsubstituted ULA and from C1 to C20 hydrocarbons comprising 0 to 15 heteroatoms as defined with respect to linker substituents elsewhere in this specification, and further from donor and acceptor substituents as defined in this specification;
wherein, if said ULA is substituted, substituents may be selected from donor substituents and acceptor substituents, possibly separated from ULA by linker substituents or moieties as defined in this specification. Preferably, substituents of ULA are selected from donor substituents, possibly separated from ULA by linker substituents or moieties.

In order to determine whether a substituent is a donor and/or acceptor, and also to quantify strength of the donor or acceptor substituent the (ground state) oxidation potential or HOMO value of a given compound is determined for assessing donor quality of a substituent and the exited state oxidation potential of a compound is determined for assessing acceptor quality of a substituent.

More specifically with respect to the donor, the stronger a donor is, the more negative the oxidation potential $E_{(S+/S)}$ vs NHE (normal hydrogen electrode) will become. E is the energy, S+ is the positively charged (oxidized) overall sensitizer and S is the sensitizer (for example compound 9). Donors predominantly, that is to a major extent, decrease $E_{(S+/S)}$. Donors affect $E_{(S+/S*)}$ (see below) only to a lesser, minor extent, but may also somewhat result in a decreased $E_{(S+/S*)}$ value.

One can thus generally also say that the presence of a donor results in a less positive $E_{(S+/S)}$ vs NHE.

On the other hand, the presence or absence of an acceptor, and also the strength of the acceptor, may be assessed using the above-mentioned "exited state oxidation potential" $E_{(S+/S*)}$, which is sometimes referred to as LUMO in the literature, although this is not rigorously correct. E is again energy, S+ the positively charged (oxidized) overall sensitizer and S* the photon induced exited sensitizer. The stronger the acceptor is, the more positive the $E_{(S+/S*)}$ value will become when compared to NHE. An acceptor thus increases the $E_{(S+/S*)}$ value. An acceptor may also shift, but to a lesser extent, $E_{(S+/S)}$ more positive.

Since $E_{(S+/S*)}$ vs NHE values are in many cases negative values (smaller than 0), one can generally also say that the presence of an acceptor results in a less negative $E_{(S+/S*)}$ vs NHE.

In order to assess whether a given substituent in a compound is a donor substituent, one has to compare the $E_{(S+/S)}$ value of the compound to the respective value of a compound that lacks the substituent but is otherwise identical to the compound. If the compound with the substituent has a more negative (less positive) $E_{(S+/S)}$ value (compared to NHE) than the compound lacking the substituent, then it is concluded that the substituent is a donor. The extent of the difference may be an indication of the donor strength.

Preferably, in order to be a donor substituent for the purpose of the present invention, the $E_{(S+/S)}$ vs NHE value of the compound with the substituent is more negative than the $E_{(S+/S)}$ vs NHE value of the compound lacking the substituent. In order to account for possible measurement errors, one can say that a given substituent is a donor, if the $E_{(S+/S)}$ vs NHE value of the compound is ≥1%, preferably 2%, preferably 3%, 4%, and most preferably ≥5% less positive compared to the $E_{(S+/S)}$ vs NHE value of the compound lacking the substituent.

In order to assess whether a given substituent in a compound is an acceptor substituent, one has to compare the $E_{(S+/S*)}$ value of the compound to the respective value of a compound that lacks the substituent but is otherwise identical to the compound. If the compound with the substituent has a more positive (less negative) $E_{(S+/S*)}$ value (compared to NHE) than the compound lacking the substituent, then it is concluded that the substituent is an acceptor. The extent of the difference is an indication of the acceptor strength.

Preferably, in order to be an acceptor substituent for the purpose of the present invention, the $E_{(S+/S*)}$ vs NHE value of the compound with the substituent is more positive than the $E_{(S+/S*)}$ vs NHE value of the compound lacking the substituent. In order to account for possible measurement errors, one can say that a given substituent is an acceptor, if the $E_{(S+/S*)}$ vs NHE value of the compound is ≥3%, preferably 4%, 5%, and most preferably ≥6% more positive and/or less negative compared to the $E_{(S+/S*)}$ vs NHE value of the compound lacking the substituent.

In Examples 4 to 6 further below, the $E_{(S+/S)}$ vs NHE and $E_{(S+/S*)}$ vs NHE of exemplary compounds are determined and the nature (donor, acceptor) of substituents is thereby determined. The procedures given in Examples 4 to 6 are used, for the purpose of the present invention, for assessing whether a substituent is a donor substituent and/or an acceptor substituent or none of these.

Besides donor substituents, acceptor substituents and anchoring groups, all of which may be separated from the core structure by way of a linker, the core structure may comprise further substituents, which do not substantially interfere with the function of the overall sensitizer. Such substituents generally do not affect the $E_{(S+/S)}$ and $E_{(S+/S*)}$ values of the compound. As such substituents are not necessary, they are not detailed here, but it is mentioned that the compounds of formulae (I) to (VI) and (VII) to (XII) have nine and some of them even ten (in case Y is $SiR^{10}R^{11}$) available positions for substituents. If for example, the compound comprises two donor substituents and one acceptor substituent that also contains the anchoring group, there remain thus 6 or 7 substitutable hydrogen atoms. Such substituents may be selected from any type of substituents, and for the purpose of completeness, it is indicated that such substituents may be selected from C1 to C30 hydrocarbons comprising 0 to 20 heteroatoms, preferably C1 to C15 hydrocarbons comprising 0 to 10 heteroatoms and most preferably C1 to C10 hydrocarbons comprising 0 to 5 heteroatoms. Most preferably, such other substituents not being associated with or exhibiting any one of an acceptor, anchoring or donor function, are absent.

According to an embodiment, said electrochemical device is a photoelectrochemical device.

According to an embodiment, said electrochemical and/or optoelectronic device is selected from the group consisting of a photovoltaic cell, a light emitting device, an electrochromic device, a photo-electrochromic device, an electrochemical sensor, a biosensor, an electrochemical display, and devices that are combinations of two or more of the aforementioned.

According to a preferred embodiment, said electrochemical and/or optoelectronic device is a dye sensitized solar cell (DSSC).

According to an embodiment, said electrochemical device, in particular said DSSC, is regenerative.

Electrochemical devices in accordance with the invention preferably comprise two electrodes and one or more layer between the electrodes.

Electrochemical devices in accordance with the invention preferably comprise a semiconductor material. Preferably, the electrochemical device comprises a layer and/or surface comprising and/or made from said semiconductor material.

Figure 9:
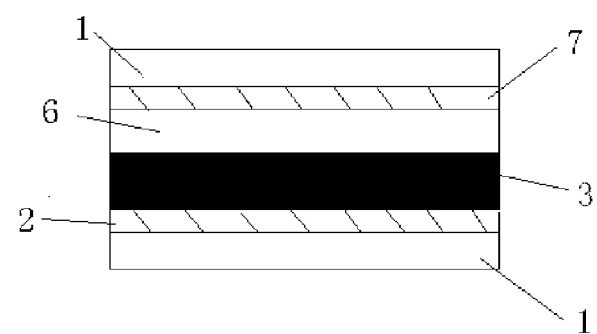
FIG. 9 is a schematic representation of a DSSC according to an embodiment of the invention.
Figure 10:
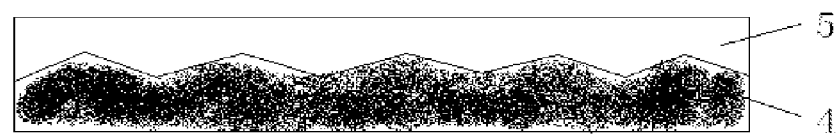
FIG. 10 is a schematic representation of a light adsorption layer 3 of the DSSC shown in FIG. 9.

In the figures, FIG. 9 schematically shows a dye-sensitized solar cell.

In dye-sensitized solar cells, one of the electrodes is preferably a photoelectrode and/or a photoanode. This photoelectrode preferably comprises and/or consists essentially of a semiconductor material. The semiconductor material, in combination with a dye or sensitizer (or sensitizing dye) adsorbed on a surface of said layer may be regarded as a light absorption layer, as discussed in more detail further below.

The device of the present invention generally comprises at least one substrate 1. Contrary to the device shown in FIG. 9, the present invention also encompasses devices having only one substrate 1, for example only a top or only a bottom substrate 1. Preferably, there is a substrate facing the side of the device intended to be exposed to electromagnetic radiation for production of electrical current. The substrate facing radiation is preferably transparent. Transparency, for the purpose of the present invention, generally means that the respective structure (for example substrate, counter electrode, conductive layer, porous semiconductor) is transparent to at least some visible light, infrared light and/or UV light, in order to convert this light to electrical energy in the device of the invention.

The substrate 1 may be made from plastic or from glass. In flexible devices, the substrate 1 is preferably made from plastic.

The conversion devices of the present invention generally have two conductive layers 2 and 7, wherein a first conductive layer 2 is required for removing the electrons generated from the device, and a second conductive layer 7 for supplying new electrons, or, in other words, removing holes. The conductive layers 2 and 7 may be provided in many different forms and may be made from various materials, depending on the purpose or nature of the device.

The second conductive layer 7 may be part of the substrate 1, as is the case, for example with ITO (indium tin oxide)-coated plastic or glass, where the transparent ITO is coated on the plastic or glass and makes the later electrically conductive.

Accordingly, one or both conductive layers 2 and 7 may comprise a transparent metal oxide, such as indium doped tin oxide (ITO), fluorine doped tinoxide (FTO), $ZnO-Ga_2O_3$, $ZnO-Al_2O_3$, tin-oxide, antimony doped tin oxide (ATO) and zinc oxide.

According to embodiments of the invention, only the first conductive layer 2 or only the second conductive layer 7 comprises a transparent metal oxide layer as defined above. It is also possible to provide one or both of the two opposed conductive layers 2 and 7 in the form of a conductive foil, for example a metal foil, in particular a titanium foil or zinc foil. This is preferred, for example, in some flexible devices. Such a foil may not be transparent.

The device of the present invention generally comprises a counter electrode 7, which faces an intermediate layer 6 towards the inside of the cell, and the substrate 1 on the outside of the cell, if such substrate is present. The counter electrode generally comprises a catalytically active material, suitable to provide electrons and/or fill holes towards the inside of the device. The counter electrode may thus comprises materials selected from material selected from Pt, Au, Ni, Cu, Ag, In, Ru, Pd, Rh, Ir, Os, C, conductive polymer and a combination of two or more of the aforementioned, for example. Conductive polymers may be selected from polymers comprising polyaniline, polypyrrole, polythiophene, polybenzene and acetylene, for example.

In FIG. 9, layer 3 is a light absorption layer, which comprises actually at least two separate layers, namely a porous semiconductor layer 4 and, absorbed thereon, a sensitizer layer 5. The sensitizer layer may comprise one or more of the group consisting of: organo-metallic sensitizing compounds, metal free organic sensitizing compounds, inorganic sensitizing compounds such as quantum dots, Sb2S3 (Antimonysulfide, for example in the form of thin films), and combinations of the aforementioned.

The sensitizer may, for example, comprise sensitizing dyes 5. If the sensitizer layer 5 comprises a dye, it generally comprises, besides optional co-adsorbed compounds, such as those disclosed in WO2004/097871A1, for example, at least one dye or sensitizer, or a combination of two or more different sensitizers. Examples for organometallic compounds encompass ruthenium dyes, as they are currently used in such devices. Suitable ruthenium dyes are disclosed, for example, in WO2006/010290.

The dye layer may comprise organic sensitizers. For example, the device may be free of any sensitizer using ruthenium or another noble metal.

According to a preferred embodiment of the invention, the sensitizer layer 5 or dye comprises the compound of the present invention.

The porous semiconductor layer may be produced by processes described in the art (B. O'Reagan and M. Grätzel, Nature, 1991, 353, 373) from semiconductor nanoparticles, in particular nanocrystalline particles. Such particles generally have a mean diameter of about 0-50 nm, for example 5-50 nm. Such nanoparticles may be made from a material selected from the group of Si, $TiO_2$, $SnO_2$, ZnO, $WO_3$, $Nb_2O_5$ and $TiSrO_3$, for example. The constitution of the porous layers from nanocrystalline particles 4 is only schematically indicated by the zig-zag-line in FIG. 11.

The device of the present invention has a layer 6 having the general purpose of mediating the regeneration of electrons in the dye, which were removed due to radiation. This layer may generally be referred to as the charge transport layer. These electrons are provided by the counter electrode 7, and layer 6 thus mediates the transport of electrons from the counter electrode to the dye, or of holes from the dye to the counter electrode.

The transport of electrons and/or holes may be mediated by a number of ways, such as, for example, by way of (a) an solvent (preferably organic solvent) based electrolyte (EP 1507307, partly; EP 1 180 774, partly), (b) an ionic liquid-based electrolyte (EP 0737358, WO 2007/093961, WO2009/083901), and (c) in solid state devices, by an organic electrically conductive material (for example as disclosed in WO 2007/107961). In the latter, charges are transported by electronic motion and not by material migration/diffusion. In the case of (a) and (b), charges are transported by way of a redox mediator, such as the iodide/triiodide couple or other redox couples, such as cobalt-complex based redox-couples (WO 03/038508).

The references mentioned in this specification are totally and entirely incorporated herein by reference. Many of these references generally relate to DSSCs and thus also contain information regarding fabrication of such devices.

According to an embodiment, the device of the present invention comprises at least one substrate layer 1, a conductive layer 2, a light absorption layer 3, a preferably doped organic charge transport material or an electrolyte layer 6, and a counter electrode 7, wherein said conductive layer 2, said light absorption layer 3, said organic charge transport or electrolyte layer 6 and said counter electrode 7 are connected in series. According to a preferred embodiment, the device comprises two transparent substrates 1, on the top and the bottom of the device, respectively. The top of the device corresponds to the top of the drawing in FIG. 9. Generally, the top corresponds to the side where the major part of light enters the device.

The device of the present invention may be a flexible device, as disclosed, for example, by Seigo Ito et al. Chem. Comm. 2006, 4004-4006, in EP1095387, and in WO 2009/098643, FIG. 5, and the description related to this figure, for example.

According to an embodiment, the flexible device of the present invention is an inversed solar cell, with electromagnetic radiation entering the cell mainly from the side of the counter electrode (back illumination). This is also disclosed in the references mentioned in the above paragraph.

The present invention will now be illustrated by way of examples. These examples do not limit the scope of this invention, which is defined by the appended claims.

EXAMPLES

Example 1

Synthesis of Novel Sensitizers (Compounds 9 to 11)

General Information:

All commercially obtained reagents were used as received. Thin-layer chromatography (TLC) was conducted with Merck KGaA pre-coated TLC Silica gel 60 $F_{254}$ aluminum sheets and visualized with UV and potassium permanganate staining. Flash column chromatography was performed using Silicycle UltraPure SilicaFlash P60, 40-63 μm (230-400 mesh) (Still, W. C. et al. *J. Org. Chem.* 1978, 43, 2923.). $^1$H NMR spectra were recorded on a Bruker Avance-400 (400 MHz), Bruker AvanceIII-400 (400 MHz), or Bruker DPX-400 (400 MHz) spectrometer and are reported in ppm using solvent as an internal standard (CDCl$_3$ at 7.26 ppm). Data reported as: s=singlet, d=doublet, t=triplet, q=quartet, p=pentet, m=multiplet, b=broad, ap=apparent; coupling constant(s) in Hz; integration. UV-Vis spectrums were measured with a Hewlett Packard 8453 UV-Vis spectrometer. Cyclic voltammetry was measured with an Autolab Eco Chemie cyclic voltammeter.

Figure 1:
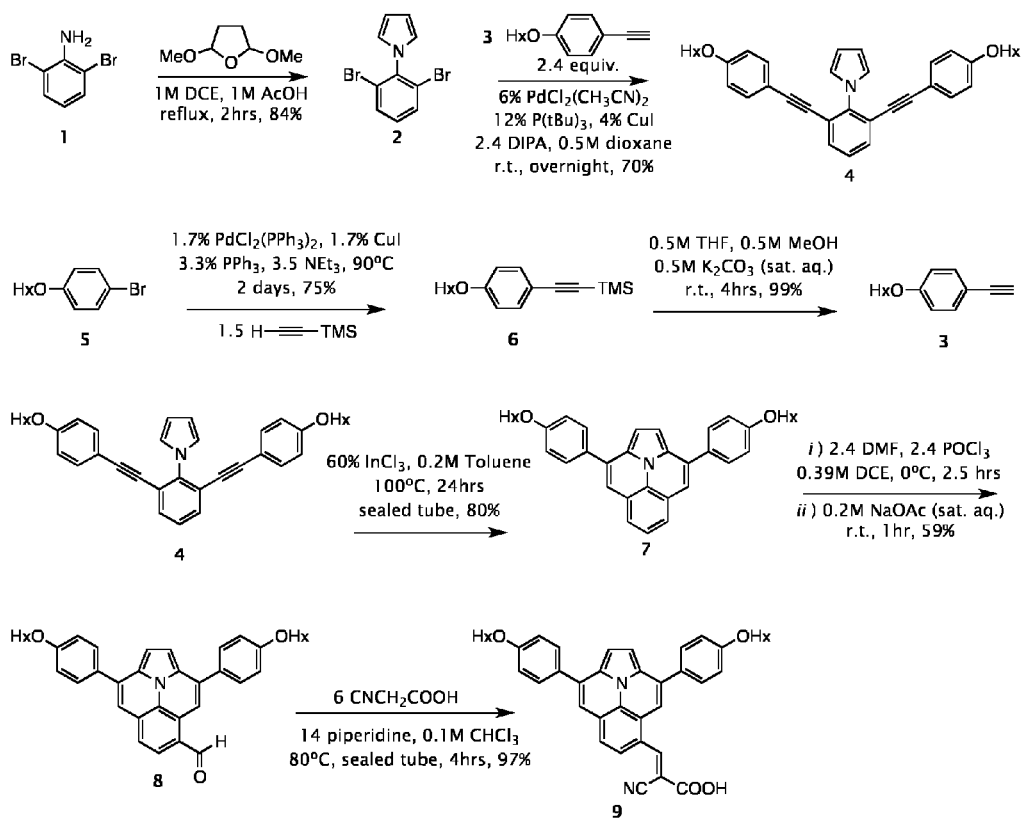
FIG. 1 schematically represents the synthetic route for the synthesis of dyes 9 according to a preferred embodiment of the present invention.
Figure 2:
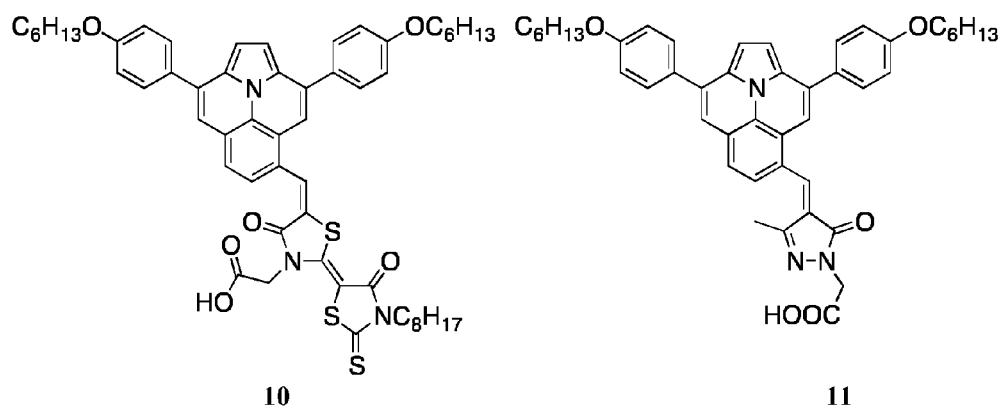
FIG. 2 shows the dyes 10 and 11 according to further preferred embodiments of the invention.

Synthetic Route:

Dyes 9, 10 and 11 were prepared beginning with commercially available aniline 1 (FIG. 1). The Paal-Knorr condensation proceeded in 84% yield to give the desired arylpyrrole 2. Double Sonogashira coupling with an excess of alkyne 3 led to bis-alkyne intermediate 4 in 70% yield. Coupling partner 3 was synthesized in two steps from commercial starting material 5 via Sonogashira coupling with TMS-alkyne to give intermediate 6 followed by hydrolytic silyl deprotection to give 3 in 74% over 2-steps. 4 underwent Lewis acid catalyzed cyclization/hydride shift to give 7 in 80% yield. Ullazine 7 was then subjected to a modified Vilsmeier-Haack reaction to give the formylated Ullazine 8 in 59% yield. Intermediate 8 was then divided among three Knoevenagle condensations with an Edaravone derivative, a Rhodanine dimer and cyanoacetic acid to give dyes 11, 10 and 9, respectively (FIG. 2). Specifically, 8 underwent Knoevenagel condensation with cyanoacetic acid to from dye 9 in 97% yield.

1-(2,6-dibromophenyl)-1H-pyrrole (2)

To a 200 mL round bottom flask was added 2,6-dibromoaniline (8.63 g, 34.7 mmol, 1.0 equiv.), dichloroethane (35.0 mL, 1.0 M), acetic acid (35.0 mL, 1.0 M), and 2,5-dimethoxytetrahydrofuran (10.5 mL, 3.3 M). A reflux condenser was fitted to the flask and the mixture was heated to reflux for 2 hours. During this time the solution slowly changes colors from clear to yellow. An aliquot was removed and the reaction was judged complete by NMR. The mixture was diluted with CH$_2$Cl$_2$, rinsed with H$_2$O, and then rinsed with saturated aqueous K$_2$CO$_3$. The organic layer was dried over MgSO$_4$ and filtered through a pad of SiO$_2$ with CH$_2$Cl$_2$ as eluent. The oil was place under high vacuum overnight to remove the excess 2,5-dimethoxytetrahydrofuran. During this time 1-(2,6-dibromophenyl)-1H-pyrrole, 2, changes to a white solid (8.72 g, 29.1 mmol, 84%). $^1$H NMR (400 MHz, CDCl$_3$) δ 7.68 (d, J=8.0 Hz, 2H), 7.18 (t, J=8.4 Hz, 2H), 6.72 (t, J=2.0 Hz, 2H), 6.42 (t, J=2.0 Hz, 2H).

((4-(hexyloxy)phenyl)ethynyl)trimethylsilane (6)

To a 500 mL N$_2$ filled round bottom flask was added 1-bromo-4-(hexyloxy)benzene (20.5 g, 80.0 mmol, 1 equiv.) and DMF (160 mL, 0.5 M). The mixture was then sparged with bubbling N$_2$. To this mixture was added N$_2$-sparged triethylamine (39.0 mL, 280 mmol, 3.5 equiv.) via syringe. Finally, copper (I) iodide (254.0 mg, 1.33 mmol, 1.7%), triphenylphosphine (603.0 mg, 2.67 mmol, 3.3%) and PdCl$_2$(PPh$_3$)$_2$ (933.0 mg, 1.33 mmol, 1.7%) were added as a single portion and the head space was flushed with N$_2$. Ethynyltrimethylsilane (16.9 mL, 120.0 mmol, 1.5 equiv.) was added via syringe to the mixture. The flask was sealed with a ground glass stopper, Teflon tape, and then electrical tape and heated to 90° C. for 48 hours. After 48 hours the mixture was diluted with hexanes and extracted with 10% H$_3$PO$_4$ then 5% K$_2$CO$_3$. The organic layer was then dried with MgSO$_4$ and filtered through a plug of SiO$_2$ with 100% hexanes. Upon evaporation, ((4-(hexyloxy)phenyl)ethynyl)trimethylsilane was isolated as a clear oil (16.45 g, 60.2 mmol, 75%). $^1$H NMR (400 MHz, CDCl$_3$) δ7.42 (d, J=9.2 Hz, 2H), 6.83 (d, J=8.8 Hz, 2H), 3.98 (t, J=6.4 Hz, 2H), 1.85-1.73 (m, 2H), 1.52-1.42 (m, 2H), 1.41-1.26 (m, 4H), 0.94 (t, J=7.6 Hz, 3H), 0.27 (s, 9H).

1-ethynyl-4-(hexyloxy)benzene (3)

To a 500 mL round bottom flask was added ((4-(hexyloxy)phenyl)ethynyl)trimethylsilane, 6, (14.95 g, 54.7 mmol, 1.0 equiv.) followed by THF (100 mL, 0.5 M), MeOH (100 mL, 0.5 M) and saturated aqueous K$_2$CO$_3$ (100 mL, 0.5 M). The mixture was stirred rapidly at room temperature for 4 hours. After 4 hours, the mixture was diluted with hexanes and rinsed with H$_2$O (3×). The organic layer was dried with MgSO$_4$ and the organics were filtered through a thin SiO$_2$ pad with 5% ethyl acetate/95% hexanes to give 1-ethynyl-4-(hexyloxy)benzene, 3, as a clear oil (10.9 g, 54.2 mmol, 99%). $^1$H NMR (400 MHz, CDCl$_3$) δ 7.45 (d, J=8.8 Hz, 2H), 6.86 (d, J=8.8 Hz, 2H), 3.99 (t, J=6.4 Hz, 2H), 3.02 (s, 1H), 1.81 (ap. p, J=8.0 Hz, 2H), 1.53-1.40 (m, 2H), 1.40-1.32 (m, 4H), 0.94 (t, J=7.2 Hz, 3H).

1-(2,6-bis((4-(hexyloxy)phenyl)ethynyl)phenyl)-1H-pyrrole (4)

To a flame dried N$_2$-filled 200 mL round bottom flask was added PdCl$_2$(CH$_3$CN)$_2$ (525.0 mg, 2.03 mmol, 6.0%) and CuI (275.6 mg, 1.35 mmol, 4.0%) as a single portion. The head space was flushed with N$_2$ before addition of dioxane (70.0 mL, 0.5 M), P(tBu)$_3$ (4.06 mL, 4.06 mmol, 1.0 M solution in Toluene), diisopropylamine (11.45 mL, 81.12 mmol, 2.4 equiv.), 1-ethynyl-4-(hexyloxy)benzene (16.4 g, 81.12 mmol, 2.4 equiv.) and 1-(2,6-dibromophenyl)-1H-pyrrole (10.1 g, 33.8 mmol, 1.0 equiv.) sequentially by syringe. The reaction was stirred at room temperature under N$_2$ overnight. In minutes a precipitate begins to form on the sides of the flask with a gentle exotherm. After 18 hours the reaction was diluted with Et$_2$O and rinsed with 10% H$_3$PO$_4$ (2×), then 5% K$_2$CO$_3$. The organics were dried over MgSO$_4$ and concentrated. After silica gel column chromatography with 25% CH$_2$Cl$_2$:hexanes→40% CH$_2$Cl$_2$:hexanes, 1-(2,6-bis((4-(hexyloxy)phenyl)ethynyl)phenyl)-1H-pyrrole, 4, was isolated as a pale oil (12.7 g, 23.66 mmol, 70%). $^1$H NMR (400 MHz, CDCl$_3$) δ 7.55 (d, J=8.0 Hz, 2H), 7.35-7.27 (m, 5H), 7.09 (t, J=2.4 Hz, 2H), 6.66 (d, J=9.2 Hz, 4H), 6.40 (t, J=2.4 Hz, 2H), 3.98 (t, J=6.4 Hz, 4H), 1.80 (ap. p, J=7.2 Hz, 4H), 1.54-1.45 (m, 4H), 1.43-1.27 (m, 8H), 0.93 (t, J=6.8 Hz, 6H).

3,9-bis(4-(hexyloxy)phenyl)indolizino[6,5,4,3-ija]quinoline (7)

To a flamed, N$_2$-filled 25 mL round bottom flask was added 1-(2,6-bis((4-(hexyloxy)phenyl)ethynyl)phenyl)-1H-pyrrole (542.0 mg, 1.01 mmol, 1.0 equiv.) and toluene (5.0 mL, 0.2 M). InCl$_3$ (132.6 mg, 0.6 mmol, 60%) was added rapidly in one portion and the head space was flushed with N$_2$ and the flask was sealed with a ground glass stopper and electoral tape before heating to 100° C. for 24 hours. After 24 hours the reaction mixture was directly passed through a pad of SiO$_2$ with 5% ethyl acetate:hexanes. Note: care must be taken to ensure all product elutes, whereas streaking is apparent under long-wave UV lamp irradiation. The product was then purified through silica gel chromatography with 50% CH$_2$Cl$_2$:Hx to give 3,9-bis(4-(hexyloxy)phenyl)indolizino[6,5,4,3-ija]quinoline as a canary yellow solid (431.0 mg, 0.81 mmol, 80%). $^1$H NMR (400 MHz, CDCl$_3$) δ 7.76 (d, J=8.4 Hz, 4H), 7.52-7.40 (m, 3H), 7.22 (s, 2H), 7.09 (s, 2H), 7.08 (d, J=8.4 Hz, 4H), 4.08 (t, J=6.4 Hz, 4H), 1.88 (ap. p, J=7.2 Hz, 4H), 1.60-1.48 (m, 4H), 1.50-1.35 (m, 8H), 0.97 (t, J=7.2 Hz, 6H). UV-Vis (CHCl$_3$): $\lambda_{max}$=392 nm (ε=19,400 M$^{-1}$ cm$^{-1}$), λ=280 nm (ε=50,600 M$^{-1}$ cm$^{-1}$), $\lambda_{onset}$=420 nm. Cyclic Voltammetry (0.1 M Bu$_4$NPF$_6$ in CH$_2$Cl$_2$, sweep width 1.0–(−2.0), 2.0 V/s scan rate, 5 mV step): $E^{(S+/S)}$=0.89 V (vs NHE). $E_g^{opt}$=2.96 V. $E^{(S+/S^*)}$=−2.07 V [vs NHE, calculated from $E^{(S+/S^*)}$=($E^{(S+/S)}$−$E_g^{opt}$)].

3,9-bis(4-(hexyloxy)phenyl)indolizino[6,5,4,3-ija]quinoline-5-carbaldehyde (8)

To a flame dried, N$_2$-filled 20 mL round bottom flask was added 3,9-bis(4-(hexyloxy)phenyl)indolizino[6,5,4,3-ija]quinoline (500.0 mg, 0.93 mmol, 1.0 equiv.), dichloroethane (2.4 mL, 0.39 M) and anhydrous DMF (173.0 µL, 2.23 mmol, 2.4 equiv.). The starting material proves insoluble at 0° C. The reaction was kept at room temperature and 7.0 mL of DCE added. POCl$_3$ (207.0 µL, 2.23 mmol, 2.4 equiv.) was added dropwise via syringe at room temperature. TLC at 2.5 hours on an aliquot quenched with sat. aq. NaOAc shows complete consumption of the starting material. The reaction mixture was diluted with 10 mL of CH$_2$Cl$_2$ and 10 mL of NaOAc (sat. aq.). The mixture was then stirred rapidly for 1 hour. During this time the solution color changes from dark purple to a yellow/orange. The product was isolated off of a long silica gel column with 100% CH$_2$Cl$_2$ to give 3,9-bis(4-(hexyloxy)phenyl)indolizino[6,5,4,3-ija]quinoline-5-carbaldehyde as a yellow solution/orange solid (310.0 mg, 0.55 mmol, 59%). $^1$H NMR (400 MHz, CDCl$_3$) δ 10.30 (s, 1H), 9.09 (s, 1H), 7.89 (d, J=8.0 Hz, 1H), 7.84 (d, J=8.8 Hz, 2H), 7.79 (d, J=9.2 Hz, 2H), 7.59 (d, J=8.0 Hz, 1H) 7.49 (s, 1H), 7.45 (s, 2H), 7.11 (ap. d, J=8.8 Hz, 4H), 4.09 (t, J=6.4 Hz, 4H), 1.88 (ap. p, J=7.2 Hz, 4H), 1.60-1.50 (m, 4H), 1.45-1.35 (m, 8H), 0.96 (t, J=6.4 Hz, 6H).

(E)-3-(3,9-bis(4-(hexyloxy)phenyl)indolizino[6,5,4,3-ija]quinolin-5-yl)-2-cyanoacrylic acid (9)

To a 5 mL round bottom flask was added 3,9-bis(4-(hexyloxy)phenyl)indolizino[6,5,4,3-ija]quinoline-5-carbaldehyde (100.0 mg, 0.178 mmol, 1.0 equiv.), chloroform (1.8 mL, 0.1 M), cyanoacetic acid (90.0 mg, 1.062 mmol, 6.0 equiv.) and piperidine (122.2 µL, 210.6 mg, 14.0 equiv.). The head space was flushed with N$_2$, and the flask was sealed with a ground glass stopper and electrical tape before heating to 80° C. for 4 hours. By 1 hour the solution turns bright red. After 4 hours, the reaction was diluted with CH$_2$Cl$_2$ and AcOH was added to ensure acidity before rinsing with H$_2$O. AcOH addition causes a color change from bright red/orange to dark red/purple. The organic solution was dried with MgSO$_4$ and passed through a thick pad of SiO$_2$ gel until the product streaks to the bottom of the silica plug. The receiving flask was then switched and the remaining product was eluted with 3% MeOH:2% AcOH:95% CH$_2$Cl$_2$ to give (E)-3-(3,9-bis(4-(hexyloxy)phenyl)indolizino[6,5,4,3-ija]quinolin-5-yl)-2-cyanoacrylic acid as a dark red solid (108.9 mg, 0.172 mmol, 97% yield). $^1$H NMR (400 MHz, CDCl$_3$) δ 9.06 (br s, 1H), 8.69 (br d, J=9.2 Hz, 1H), 7.85-7.75 (m, 5H), 7.60-7.53 (m, 1H), 7.51 (br s, 1H), 7.46-7.40 (m, 2H), 7.17-7.09 (m, 4H), 4.10 (t, J=6.4 Hz, 4H), 1.89 (ap. p, J=6.8 Hz, 4H), 1.63-1.50 (m, 4H), 1.47-1.35 (m, 8H), 1.00-0.93 (m, 6H). UV-Vis (CHCl$_3$): $\lambda_{max}$=575 nm (ε=28,000 M$^{-1}$ cm$^{-1}$), $\lambda_{onset}$=624 nm. Cyclic Voltammetry (0.1 M Bu$_4$NPF$_6$ in CH$_2$Cl$_2$, sweep width 1.1–(−2.0), 1.0 Ws scan rate, 5 mV step): $E^{(S+/S)}$=1.09 V (vs NHE). $E_g^{opt}$=1.99 V. $E^{(S+/S^*)}$=−0.90 V [vs NHE, calculated from $E^{(S+/S^*)}$=($E^{(S+/S)}$−$E_g^{opt}$)].

2-((2E,5E)-5-(3,9-bis(4-(hexyloxy)phenyl)indolizino[6,5,4,3-ija]quinolin-5-yl)methylene)-3'-octyl-4,4'-dioxo-2'-thioxo-3',4,4',5-tetrahydro-2'H,3H-[2,5'-bithiazolylidene]-3-yl)acetic acid (10)

To a 5 mL round bottom flask was added 3,9-bis(4-(hexyloxy)phenyl)indolizino[6,5,4,3-ija]quinoline-5-carbaldehyde (100.0 mg, 0.177 mmol, 1.0 equiv.), (E)-ethyl 2-(3'-octyl-4,4'-dioxo-2'-thioxo-3',4,4',5-tetrahydro-2'H,3H-[2,5'-bithiazolylidene]-3-yl)acetate (83.9 mg, 0.195 mmol, 1.1 equiv.), chloroform (1.77 mL, 0.1 M), and piperidine (122.2 µL, 1.24 mmol, 7.0 equiv.). The headspace was flushed with N$_2$ and the flask was sealed with a ground glass stopper and electrical tape and heated to 80° C. overnight. The next morning the reaction was diluted with CH$_2$Cl$_2$ and rinsed with H$_2$O. After drying the separated organics with MgSO$_4$, the solution was concentrated and passed through a thick pad of SiO$_2$ with 100% CH$_2$Cl$_2$ as eluent until the dark blue color stops eluting and before the orange color begins. After concentration the dark blue solid was taken up in 20 mL of THF and 20 mL of 2.0 M LiOH (aq.) solution was added with rapid stirring for 3 hours at room temperature. After dilution with ethyl acetate and acetic acid until the solution was acidic, the mixture was rinsed with H$_2$O, and dried over MgSO$_4$. The organics were concentrated and purified by silica gel chromatography with 100% CH$_2$Cl$_2$ until the yellow color has eluted and then 5% MeOH:CH$_2$Cl$_2$ until the dark blue color has eluted. The dark blue solution was concentrated to a dark blue solid giving 2-((2E,5E)-5-((3,9-bis(4-(hexyloxy)phenyl)indolizino[6,5,4,3-ija]quinolin-5-yl)methylene)-3'-octyl-4,4'-dioxo-2'-thioxo-3',4,4',5-tetrahydro-2'H,3H-[2,5'-bithiazolylidene]-3-yl)acetic acid (45.0 mg, 0.047 mmol, 27% yield). $^1$H NMR (400 MHz, CDCl$_3$+1 drop NEt$_3$) δ 8.53 (br s, 1H), 7.91 (d, J=8.8 Hz, 1H), 7.80-7.65 (m, 5H), 7.60-7.50 (m, 2H), 7.38 (s, 1H), 7.15-7.00 (m, 5H), 4.75 (s, 2H), 4.20-3.90 (m, 6H), [alkyl region difficult to interpret due to broadened peaks and triethylamine overlap]. UV-Vis (CHCl$_3$): $\lambda_{max}$=607 nm, $\lambda_{onset}$=700 nm. Cyclic Voltammetry (0.1 M Bu$_4$NPF$_6$ in CH$_2$Cl$_2$, sweep width 1.1–(−2.0), 2.0 Ws scan rate, 5 mV step): $E^{(S+/S)}$=1.02 V (vs NHE). $E_g^{opt}$=1.77 V. $E^{(S+/S^*)}$=−0.75 V [vs NHE, calculated from $E_{(S+/S^*)}$=($E^{(S+/S)}$−$E_g^{opt}$)].

(E)-2-(4((3,9-bis(4-(hexyloxy)phenyl)indolizino[6,5,4,3-ija]quinolin-5-yl)methylene)-3-methyl-5-oxo-4,5-dihydro-1H-pyrazol-1-yl)acetic acid (11)

To a 5 mL round bottom flask was added 3,9-bis(4-(hexyloxy)phenyl)indolizino[6,5,4,3-ija]quinoline-5-carbaldehyde (30.0 mg, 0.054 mmol, 1.0 equiv.), ethanol (0.5 mL, 0.1 M), 2-(3-methyl-5-oxo-4,5-dihydro-1H-pyrazol-1-yl)acetic acid (12.3 mg, 0.065 mmol, 1.2 equiv.) and piperidine (19.2 µL, 0.194 mmol, 3.6 equiv.). The reaction was heated to 90° C. after sealing the flask with a ground glass stopper and electrical tape. The starting materials proved insoluble and little reaction had occurred at one hour. The reaction vessel was opened and 0.5 mL of dichloroethane was added as a co-solvent. The flask was again sealed and heated to 90° C. for 3 hours. At three hours TLC confirmed complete consumption of the starting material. The reaction was worked up by adding a small amount of acetic acid and directly filtering through a pad of SiO$_2$ with 3% MeOH:2% AcOH:95%

$CH_2Cl_2$ then 100% MeOH to give a yellow-white crystalline solid. The white solid was placed in a flask with a 20:1 mixture of DMSO:AcOH and heated to 130° C. for 10 minutes. A color change happens from clear to dark blue/purple with a clear polarity change to less polar on TLC. The mixture was then extracted with $CH_2Cl_2$ (with 30% hexanes) and rinsed with $H_2O$. The solution was dried over $Na_2SO_4$ and concentrated to a dark solid. The mixture was then purified by column chromatography with 100% $CH_2Cl_2 \rightarrow 3\%$ MeOH:$CH_2Cl_2 \rightarrow 20\%$ MeOH:$CH_2Cl_2 \rightarrow 40\%$ MeOH:$CH_2Cl_2$. (E)-2-(4-((3,9-bis(4-(hexyloxy)phenyl)indolizino[6,5,4,3-ija]quinolin-5-yl)methylene)-3-methyl-5-oxo-4,5-dihydro-1H-pyrazol-1-yl)acetic acid eluted with the final polarity change as a dark blue band which was concentrated to a black solid (36.4 mg, 0.051 mmol, 95%). $^1$H NMR (400 MHz, $CDCl_3$) δ 9.43 (d, J=8.4 Hz, 1H), minor: 8.43 (s, 1H)/major: 8.11 (s, 1H), 7.80-7.70 (m, 5H), 7.58-7.50 (m, 1H), 7.47 (s, 1H), 7.40-7.33 (m, 2H), 7.15-7.08 (m, 4H), 4.58 (s, 2H), 4.15-4.05 (m, 4H), 2.40 (s, 3H), 1.95-1.83 (m, 4H), 1.60-1.50 (m, 4H), 1.47-1.35 (m, 8H), 0.97 (t, J=6.8 Hz, 6H). UV-Vis ($CHCl_3$): $\lambda_{max}$=618 nm, $\lambda_{onset}$=696 nm. Cyclic Voltammetry (0.1 M $Bu_4NPF_6$ in $CH_2Cl_2$, sweep width 1.1–(−2.0), 1.0 V/s scan rate, 5 mV step): $E^{(S+/S)}$=1.04 V (vs NHE). $E_g^{opt}$=1.81 V. $E^{(S+/S^*)}$=−0.77 V [vs NHE, calculated from $E^{(S+/S)}-E_g^{opt}$)].

Example 2

Preparation of $TiO_2$ Substrate with Adsorbed Dye (Compound 9)

The nanocrystalline $TiO_2$ pastes were prepared using a previously reported procedure [Ito, S. et al. Fabrication of thin film dye sensitized solar cells with solar to electric power conversion efficiency over 10%. Thin Solid Films 516, 4613-4619 (2008)]. Nanocrystalline $TiO_2$ films were prepared by spreading a viscous dispersion of colloidal $TiO_2$ particles on a conducting glass support (Tec15, Pilkington or Asahi TCO glass, fluorine-doped $SnO_2$ overlayer, transmission >85% in the visible sheet resistance 7-8Ω/square) with heating under air for 30 min at 450° C. The $TiO_2$ transparent electrodes composed of ~20 nm anatase on fluorine doped tin oxide conducting glass were controlled from 2 to 14 µm by a number of screen printing. In order to render high power conversion efficiency, ~5 µm scattering layer (400 nm diameter, CCIC, HPW-400) as light scatter was deposited on the transparent layer. After cooling to room temperature the substrates were treated in an 0.02 M aqueous solution of $TiCl_4$ for 30 min at 70° C., rinsed with deionized water and dried at 450° C. during 15 min. Prior to sensitization, the $TiO_2$ substrates were heated to 500° C. during 30 min.

The resulting $TiO_2$ layers had a thickness of 12 mm and a porosity of 68%, which was determined by N2 sorption studies using Brunauer-Emmett-Teller (BET) analysis (C. J. Barbé, et al. J. Am. Ceram. Soc. 1997, 80, 3157).

After cooling to approximately 70° C. the substrates were immersed for 4 hours into a $10^{-4}$ M solution of compound 9 in a mixture of tetrahydrofuran and ethanol (1:1, volume ratio).

The high performance iodide based electrolyte coded 984 was prepared. This electrolyte contained 0.6 M 1,3-dimethylimidazolium iodide (DMII), 0.05 M NaI, 0.03M iodine, 0.1M guanidinium thiocyanate, 0.5M tert-butylpyridine and 0.05M LiI in a mixture of valeronitrile/acetonitrile (15:85 v/v).

The double layer nanocrystalline $TiO_2$ film electrode was assembled with a thermally platinized conducting glass electrode. The two electrodes were separated by a 35 µm thick hot-melt ring and sealed up by heating. The internal space was filled with the electrolyte above. After that, the electrolyte-injection hole was sealed. For the fabrication details see the reference of Wang P. et al., "A Solvent-Free, $SeCN^-$/$(SeCN)_3^-$ Based Ionic Liquid Electrolyte for High-Efficiency Dye-Sensitized Nanocrystalline Solar Cell", J. Am. Chem. Soc., 126, 2004, 7164.

Example 3

Photovoltaic Measurements

For photovoltaic measurements of the DSCs, the irradiation source was a 300 W xenon light source (Osram XBO 450, Germany) with a filter (Schott 113), whose power was regulated to the AM 1.5 G solar standard by using a reference Si photodiode equipped with a colour matched filter (KG-3, Schott) in order to reduce the mismatch in the region of 350-750 nm between the simulated light and AM 1.5 G to less than 4%. The measurement of incident photon-to-current conversion efficiency (IPCE) was plotted as a function of excitation wavelength by using the incident light from a 300 W xenon lamp (ILC Technology, USA), which was focused through a Gemini-180 double monochromator (Jobin Yvon Ltd.).

The results are shown in Table 1 below and FIGS. 7 and 8. More specifically, IPCE at 540 nm wavelength is 98.4%, at 550 nm 92.6% and at 700 nm 13.4%.

TABLE 1

Performances of DSSC employing an Ullazine-core based dye (compound 9)

| % sun | $V_{OC}$ (mV) | $J_{SC}$ (mA cm$^{-2}$) | FF | PCE η (%) |
|---|---|---|---|---|
| 9.5% | 640.39 | 1.458 | 0.768 | 7.58 |
| 51.3% | 704.17 | 7.907 | 0.759 | 8.23 |
| 100% | 729.81 | 15.38 | 0.751 | 8.39 |

Figure 7:
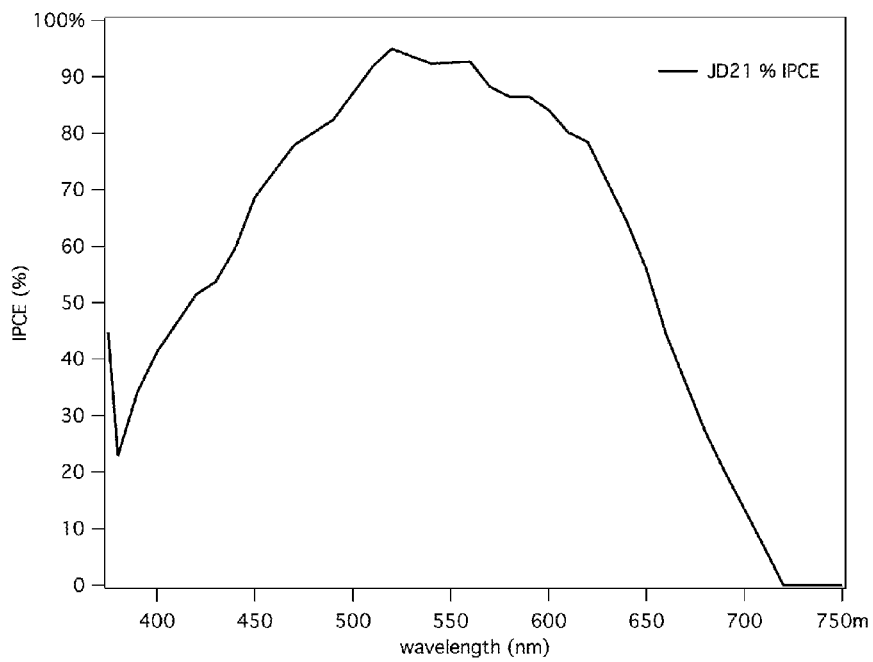
FIG. 7 shows the incident-photon to current conversion efficiency (IPCE) of a dye-sensitized solar cell (DSSC) according to an embodiment of the invention, containing the compound 9 (FIG. 1) as a sensitizing dye on 10 μm transparent $TiO_2$ layer+4 μm scattering layer.

FIG. 7 shows IPCE spectra measured with $TiO_2$ films sensitized with compound 9 where the IPCE values across the visible range reaches more than 90% and at 700 nm it is about 13%.

Figure 8:
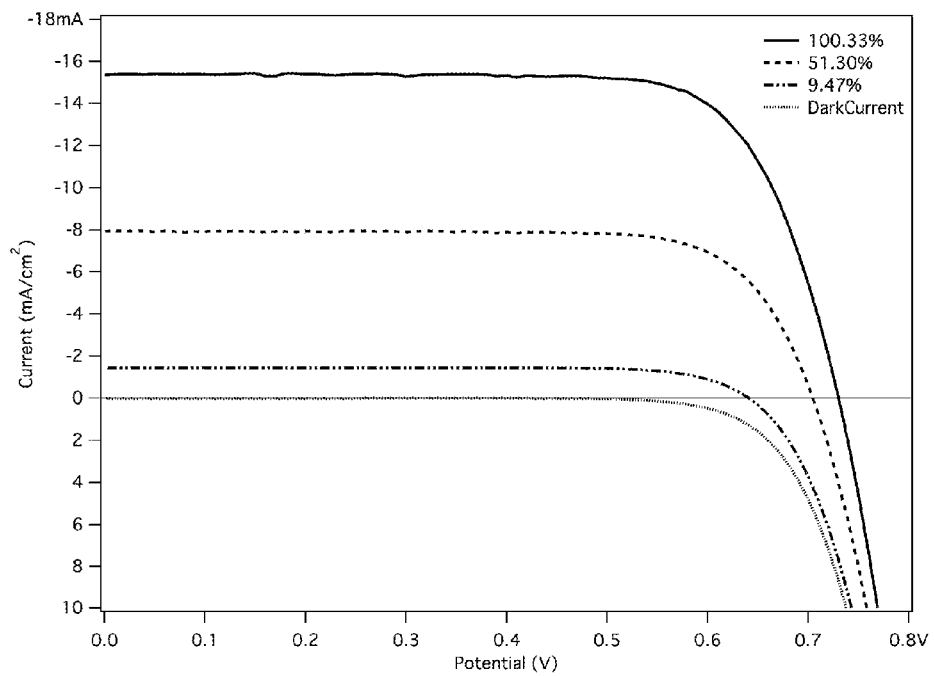
FIG. 8 shows Current (I)-Voltage (V) characteristic of the DSSC of FIG. 7 at different illumination intensities (9.47%, 51.30% and 100.33% sun).

The FIG. 8 shows the device characteristics, i.e. the open circuit voltage ($V_{oc}$), short circuit photocurrent density ($J_{sc}$), fill factor (FF) and solar to electric power conversion efficiency (PCE) under standard AM 1.5 sunlight. The $V_{oc}$ values obtained were 730 mV, the FF is 0.75 and the $J_{sc}$ is 15.4 mA/cm$^2$ resulting the power conversion efficiency of 8.39%.

CONCLUSIONS

A novel family of Ullazine chromophores were synthesized, which when adsorbed onto nanocrystalline $TiO_2$ films unexpectedly yield incident photon to electron conversion efficiency more than 90% using iodide/triiodide redox system. The Ullazine sensitized films under standard AM 1.5 sunlight, using iodide/triiodide redox system yields 8.39% power conversion efficiency, which can be enhanced significantly by optimization of the dye and the redox system for example one electron based redox couples such as cobalt complexes.

Example 4

Methodology for Determination of $E_{(S+/S)}$, $E_g$ and $E_{(S+/S^*)}$

The effects of a substituent on the values of $E_{(S+/S)}$ (ground state oxidation potential), $E_g$ (optical band gap) and $E_{(S+/S^*)}$ (the exited state oxidation potential), all vs NHE, of a compound represent parameters that can be used for assessing the quality of a substituent as a donor or an acceptor, when compared to the corresponding values of a compound lacking the substituent under examination, as has been detailed elsewhere in this specification. Herein below, the determination of these values in general (Example 4) and on the example of several compounds is set out (Examples 5 and 6).

Example 4.1

Determination of $E_{(S+/S)}$ by Way of Cyclic Voltametry (CV)

Equipment:

The ground state oxidation potential, $E_{(S+/S)}$, was determined through cyclic voltammetry (CV) with an Autolab Eco Chemie cyclic voltammeter. A 0.1M solution of tetrabutylammonium hexafluorophosphate (TBAPF$_6$) in dry dichloromethane was used as electrolyte and solvent with ferrocene as an internal standard. A 0.12 cm$^2$ working glassy carbon electrode (GCE), platinum wire counter electrode, and platinum wire reference electrode were used. Dichloromethane was used as purchased under dry and sealed conditions from Acros. Ferrocene was used as received from Aldrich.

Procedure:

To a flame dried conical 100 mL glass flask with 5 sealable openings was added 5 mL of 0.1M TBAPF$_6$ in dichloromethane solution. The working, counter and reference electrodes were each submerged in the solution while clamped to a conductive clamp which was inserted into a rubber septum. The septum were fitted to three of the flasks openings. Through an additional septum was inserted a glass pasture pipet connected to a dry, oxygen free compressed nitrogen tank. The final opening was capped with a rubber septum. A gentle bubbling of N$_2$ was carried out for 2-3 minutes, until a background CV spectrum shows no presence of oxygen as described below. If the apparatus is rigorously sealed, then an 18 gauge needle may be inserted into the non-pierced septum to allow an atmosphere release. A small amount of the compound to be measured (2-5 mg) was added neat either via syringe or spatula through the opening at the non-pierced septum. The septum was then replaced on the opening and the solution was then mixed with gentle bubbling of N$_2$ for 10-20 seconds. The pipet passing N$_2$ was then raised above the solution and a positive pressure was maintained above the solution. The electrode clamps were then connected to the Autolab Eco Chemie cylclic voltammeter leads. The CV was measured at a scan rate of 2.0 V/s with a 5 mV potential step and a sweep width from 1.1 V to −2.0 V beginning and ending at a 0V potential with scanning toward positive potentials first. It is noted that a slower scan rate is often desirable; however, to see the semi-reversible oxidation peak with ullazine containing compounds a fast scan rate is necessary. Specifically, compound 9 required a 3.0 V/s second scan rate to see a reversible oxidation (see below). A minimum of two scans were taken to ensure no oxygen was present at approximately −1.23 V vs NHE. The electrodes were switched off and a small amount of internal standard ferrocene (0.5-1.0 mg) was added to the solution through the non-pierced septum. The pipet passing N$_2$ was then resubmerged with gentle bubbling for 10-20 seconds. The pipet was then raised above the solution and a positive pressure was maintained above the solution. The electrodes were switched on and the CV was measured with the parameters mentioned above.

Calculating $E_{(S+/S)}$:

The CV shows two sets of peaks in the forward bias scan and two sets of reversible oxidation peaks. The original CV experiment with no ferrocene shows the oxidation potential of the compound only. The second CV experiment with ferrocene shows the oxidation potential of both ferrocene and the compound. The potential of the oxidation peak and reversible oxidation peak is averaged to give the oxidation potential for each component. Ferrocene is then calibrated to 0 V with the difference between the oxidation potential of ferrocene and the compound giving the oxidation potential of the compound versus ferrocene. The oxidation potential of the compound is then converted to the normal hydrogen electrode (NHE) scale by the addition of 0.70 V when the solvent is dichloromethane as described in Angew. Chem. Int. Ed. 2011, 50, 6619. This number is the $E_{(S+/S)}$ value.

Example 4.2

Determination of $E_g$ and $E_{(S+/S*)}$ Using the UV-Vis Absorption Spectrum Equipment:

The $E_g$ value was determined from the UV-Vis absorption spectrum measured with a Hewlett Packard 8453 UV-Vis spectrometer. Spectroscopic grade chloroform was used as received from Aldrich. The measurements were taken with a 10 mm path length quartz cuvette.

Procedure:

The quartz cuvette is filled with chloroform, capped and placed in the Hewlett Packard 8453 UV-Vis spectrometer. A background spectrum is then taken of the chloroform. The cuvette is removed, emptied and dried. The compound to be measured is dissolved in chloroform to give a solution for which the measured absorbance value is between 0.5 and 1.0 A.U. (For example: A $3.9 \times 10^{-5}$ M solution of compound 9 shown herein has an absorbance of 1.0 A.U.) 3.0 mL of this solution was placed in the quartz cuvette and capped. The cuvette was placed in the Hewlett Packard 8453 UV-Vis spectrometer and the absorption spectrum taken.

Calculating $E_g$:

The absorbance in A.U. at the low energy maximum absorbance peak ($\lambda_{max}$) of the UV-Vis spectrum is recorded. The onset of the maximum absorbance peak, $\lambda_{onset}$ or $\lambda_{10\% \, max}$, is then taken as the 10% absorbance height of the low energy maximum absorbance peak on the low energy side. This value may be converted to eV through the equation $E(eV) = 1240 * \lambda$ (nm), resulting in $E_g$.

Calculating $E_{(S+/S*)}$:

$E_{(S+/S*)} = E(S+/S) - E_g$ as demonstrated in A. Juris, V. Balzani, F. Barigelletti, S. Campagna, P. Belser, A. von Zelewsky, Coord. Chem. Rev., 1988, 84, 85.

Having measured $E_{(S+/S)}$ and $E_g$, $E_{(S+/S*)}$ may easily be solved for with the above equation.

Example 5

Determination of $E_{(S+/S)}$, $E_{(S+/S*)}$ and $E_g$ for compound 9

Figure 11:
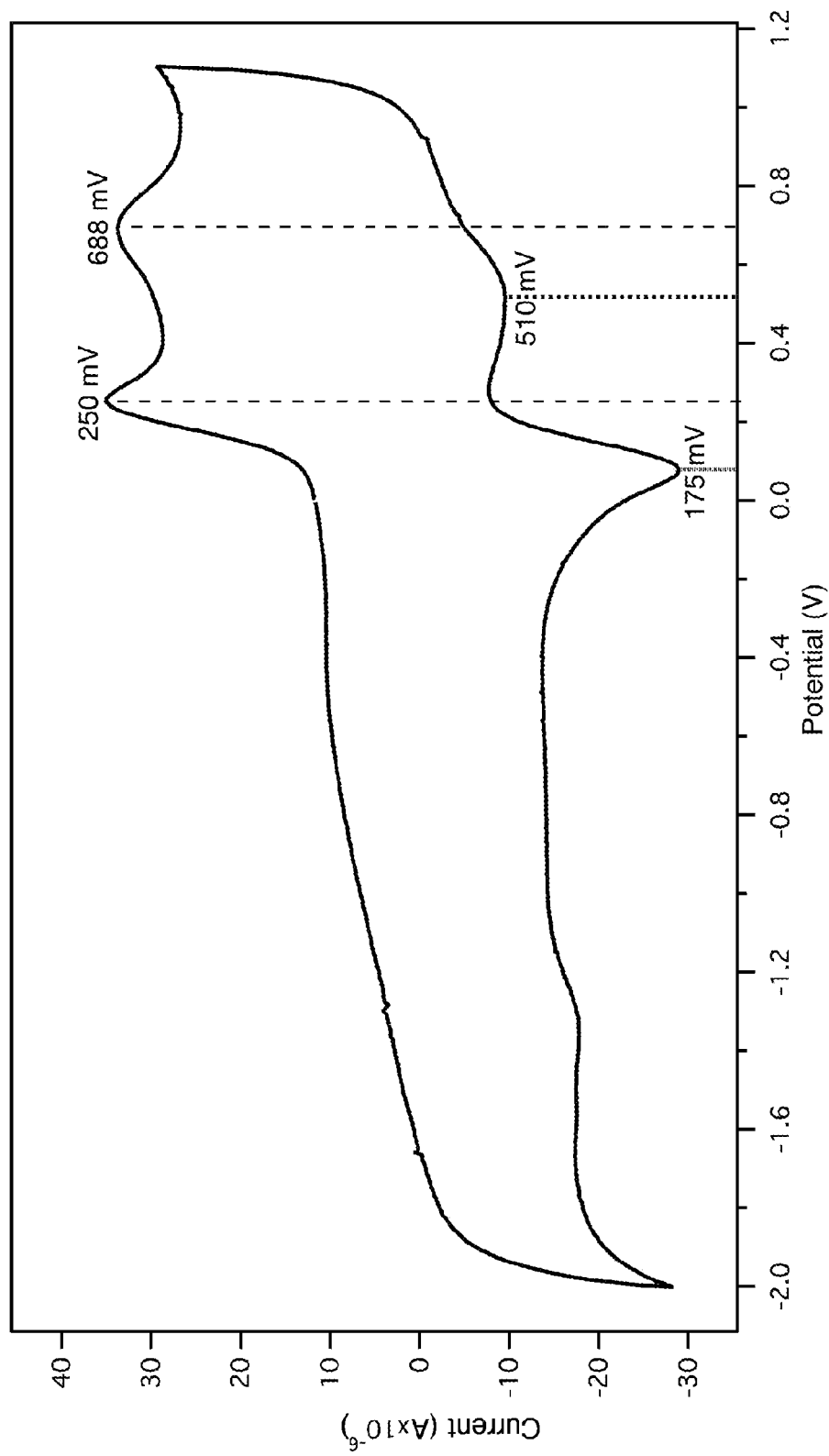
FIG. 11 shows a spectrum obtained by cyclic voltametry (CV spectrum) of compound 9 in FIG. 1 and of the internal standard ferrocene. The positions and amounts of oxidation peaks and reversible oxidation peaks of the test and reference compounds are indicated, allowing the determination of the $E_{(S+/S)}$ (vs NHE) value as described in the Examples.
Figure 12:
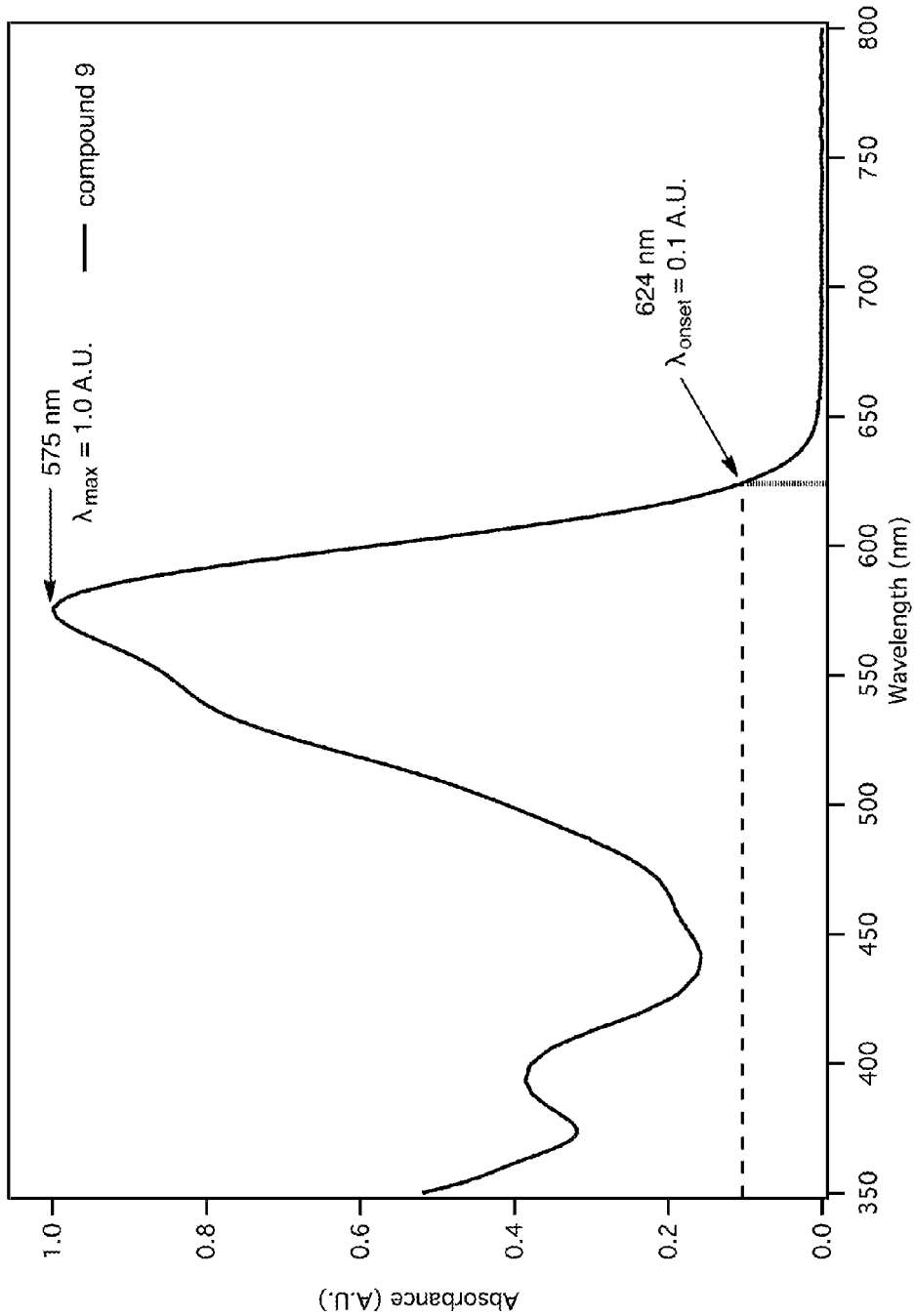
FIG. 12 shows a UV/Vis spectrum obtained from compound 9 shown in FIG. 1. The positions of the maximum absorbance peak ($\lambda_{max}$) and of the 10% absorbance height of the maximum absorbance peak from the low energy side ($\lambda_{onset}$) are indicated.

The above calculations will be exemplified with compound 9 with the CV curve show in FIG. 11 and the UV-Vis spectrum shown in FIG. 12.

$E_{(S+/S)}$: The CV curve in FIG. 11 was taken with the method described above and is an example of how the curve appears with ferrocene and compound 9 both in solution. Comparing the CV curve in FIG. 11 with the CV scan without ferrocene (not pictured) it is clear the peaks representing compound 9 are at 688 mV and 510 mV for the oxidation and reversible oxidation peaks respectively. To find the oxidation potential of compound 9 these values are averaged (688 mV+510 mV)/2=599 mV. To find the oxidation potential of ferrocene the other peaks are averaged (250 mV+175 mV)/2=213 mV. The scale is then set to reference ferrocene as the 0 V potential. For this example the potential of ferrocene is subtracted from compound 9 as follows 599 mV−213 mV=386 mV. The oxidation potential of compound 9 is 386 mV versus $Fc^+/Fc$. Ferrocene in dichloromethane is a known reference compound for the NHE scale as referenced above. To convert the oxidation potential of compound 9 to the NHE scale 700 mV is added to the oxidation potential of compound 9 vs ferrocene as follows 386 mV+700 mV=1086 mV~1.09 V versus NHE. This is the $E_{(S+/S)}$ value for compound 9 versus NHE.

$E_g$: $E_g$ was determined from the solution UV-Vis absorption spectrum of compound 9 in chloroform shown in FIG. 12. To find $E_g$ the lowest energy maximum peak ($\lambda_{max}$) is identified. For compound 9 this peak is 575 nm and the absorbance is noted at 1.0 A.U. The peak is followed on the low energy side to the 10% value of the absorbance noted for the $\lambda\text{-}_{max}$ peak, in this case 0.1 A.U. The wavelength associated with this value for compound 9 in chloroform is 624 nm. The energy in nm (624) is converted to energy in eV (1.99) according to the following equation 1240=(energy in eV)*(energy in nm)=(energy in eV)*(624 nm). 1240/624=1.99 eV=$E_g$.

$E_{(S+/S^*)}$: $E_{(S+/S^*)}$ is determined from the equation $E_{(S+/S^*)}=E_{(S+/S)}-E_g$ according to the reference cited above. For compound 9 both $E_{(S+/S)}$ and $E_g$ were found above. $E_{(S+/S^*)}$=1.09 V−1.99 V=−0.90 V.

Example 6

Determination of $E_{(S+/S)}$, $E_{(S+/S^*)}$ and $E_{(g)}$ for further compounds $E_{(S+/S)}$, $E_{(S+/S^*)}$ and $E_{(g)}$ were further determined for compounds C1, 10 and 11 (for 10 and 11 see FIG. 2), in accordance with the procedures set out in examples 4 and 5 above. The results of this and the values determined for compound 9 are given below. Also the value for U-1 (FIG. 3) was determined.

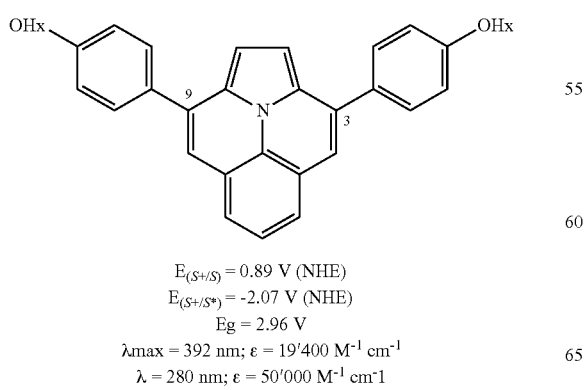

(C1)

$E_{(S+/S)}$ = 0.89 V (NHE)
$E_{(S+/S^*)}$ = −2.07 V (NHE)
Eg = 2.96 V
λmax = 392 nm; ε = 19'400 $M^{-1}$ $cm^{-1}$
λ = 280 nm; ε = 50'000 $M^{-1}$ $cm^{-1}$

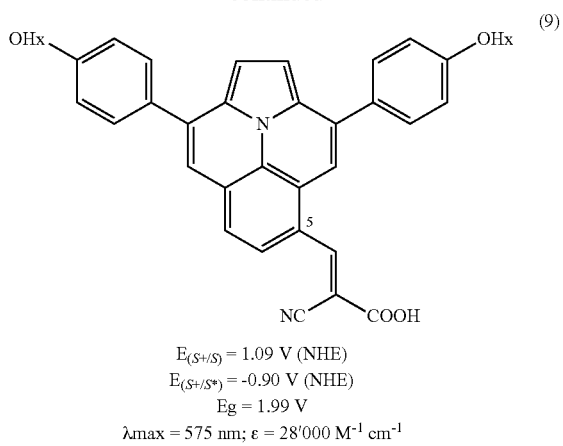

(9)

$E_{(S+/S)}$ = 1.09 V (NHE)
$E_{(S+/S^*)}$ = −0.90 V (NHE)
Eg = 1.99 V
λmax = 575 nm; ε = 28'000 $M^{-1}$ $cm^{-1}$

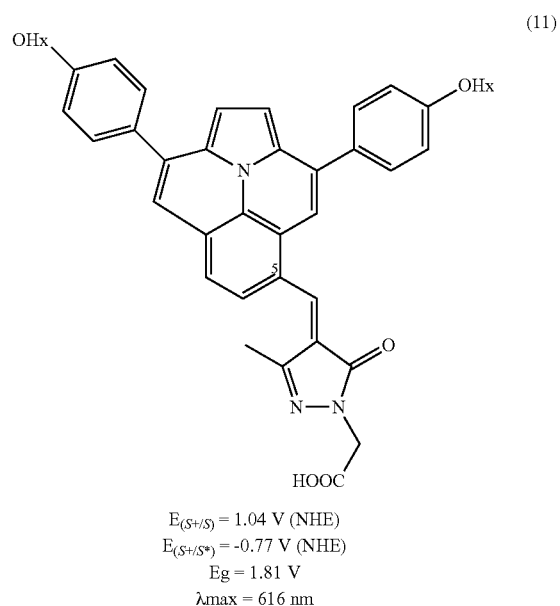

(11)

$E_{(S+/S)}$ = 1.04 V (NHE)
$E_{(S+/S^*)}$ = −0.77 V (NHE)
Eg = 1.81 V
λmax = 616 nm

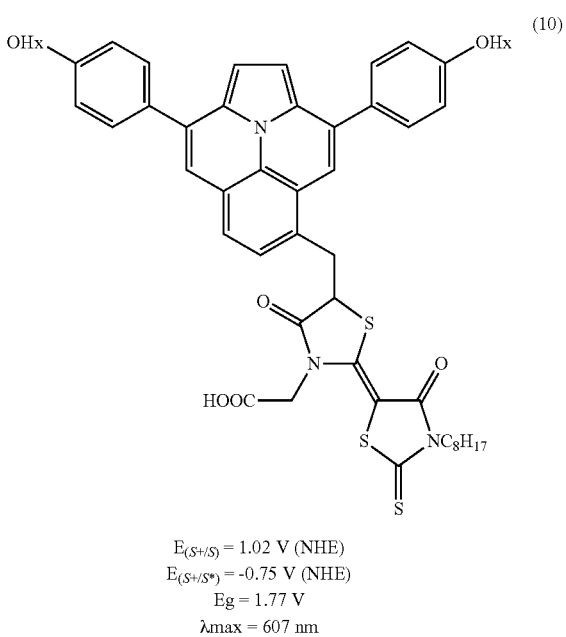

(10)

$E_{(S+/S)}$ = 1.02 V (NHE)
$E_{(S+/S^*)}$ = −0.75 V (NHE)
Eg = 1.77 V
λmax = 607 nm -continued

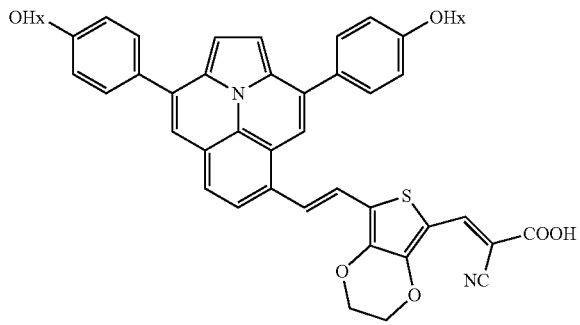

$E_{(S+/S)} = 0.86$ V (NHE)
$E_{(S+/S*)} = -0.85$ V (NHE)
Eg = 1.71 V
λmax = 586 nm (U-1)

[structure of U-1]

$E_{(S+/S)} = 0.96$ V (NHE)
$E_{(S+/S*)} = -2.07$ V (NHE)

It is first noted that the $E_{(S+/S)}$ vs NHE for compound U-1, lacking any substituent, were not determined anew, but were derived from Gerson and Metzger, 1983, Hely. Chim. Acta, 66, 7, 2031-2043. There (Table 1), compound I has a oxidation potential of +0.74 V vs SCE (Saturated Calomel Electrode), from which $E_{(S+/S)}$ vs NHE can be calculated by adding +0.24 V, resulting in an oxidation potential $E_{(S+/S)}$ vs NHE of +0.96 V. $E_{(S+/S*)}$ of compound U-1 was determined from the indications given in Balli and Zeller, 1983, Hely. Chim. Acta, 66, 7, no. 210, 2135-2139).

Compound C1 comprises a U-1 core structure, two p-O-Hexyl phenyl donor substituents but lacks any acceptor substituent. As can be seen when comparing the $E_{(S+/S)}$ and $E_{(S+/S*)}$ values of C1 with the corresponding values of compounds 9-12, one can see that the different substituents at carbon 5 of the core structure strongly increase the $E_{(S+/S*)}$, but only to a minor extent affect (also increase) the $E_{(S+/S)}$ value.

For example, when comparing C1 with compound 9, the $E_{(S+/S*)}$ has increased from −2.07 V to −0.90 V, which is an increase of +1.17 V. At the same time, the $E_{(S+/S)}$ value has increased (+0.2 V) from 0.89 to 1.09 V, which is a comparatively minor increase. Therefore, the substituent at carbon 5 in compound 9, which is absent in compound C1, is an acceptor substituent in accordance with the present invention. The substituent at carbon 5 is a substituent of formulae (LII) (see above), with a COOH group as an anchoring group.

When comparing the $E_{(S+/S*)}$ vs NHE for compound U-1 (0.96 V) with that of compound C1 (0.89 V), one can see that $E_{(S+/S)}$ for compound C1 has decreased (is less positive) by overall more than 7%. The substituents at carbons 3 and 9 that differentiate compound C1 from U-1 are thus donor substituents.

The invention claimed is:

1. A photoelectrochemical and/or an optoelectronic device comprising a compound being a substituted 16 π-electron ring system, wherein said ring system comprises four peri-fused rings, at least one nitrogen heteroatom and at least one substituent comprising an anchoring group suitable to anchor said compound on the surface of a semiconductor.

2. The device of claim 1, wherein, in said compound, two of said four rings have each a bond and/or two atoms in common with each of two other rings of said four rings, said two other rings having each a bond and/or two atoms in common with each of the other three rings of said four rings.

3. The device of claim 1, wherein said ring system comprises at least one donor substituent that comprises an electron donating (a donor) group, such that said donor substituent is capable of transferring an electron to said ring system.

4. The device of claim 1, wherein said ring system comprises at least one acceptor substituent that comprises an electron accepting group, such that said acceptor substituent can take up an electron from said ring system.

5. The device of claim 1 which is selected from a photovoltaic cell, a light emitting device, an electrochromic device, a photo-electrochromic device, an electrochemical sensor, a biosensor, and an electrochemical display.

6. The device of claim 1, which is a dye-sensitized solar cells (DSSCs).

7. The device of claim 1 comprising a counter electrode, a charge transfer material and a semiconductor material, wherein the substituted 16 π-electron ring system is adsorbed onto the surface of the semiconductor material and wherein said charge transfer material is in contact with the counter electrode and the surface of the semiconductor material.

8. The device of claim 1, wherein said compound comprises a structure according to any one of formulae (I) to (VIII) below:

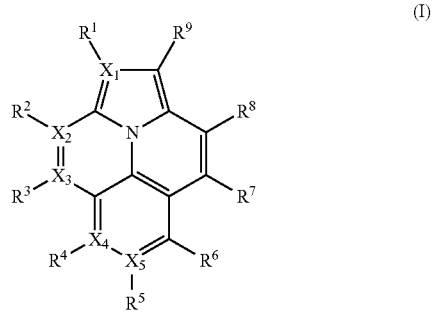

(I)

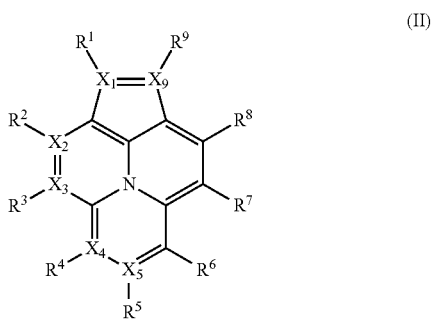

(II)

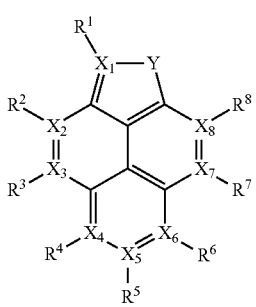
(III)

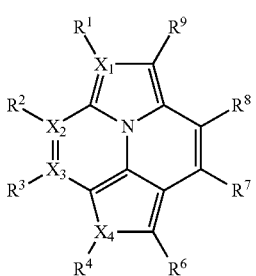
(IV)

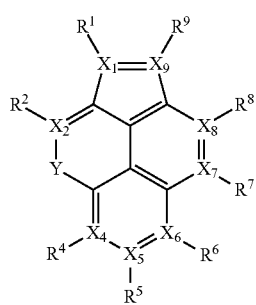
(V)

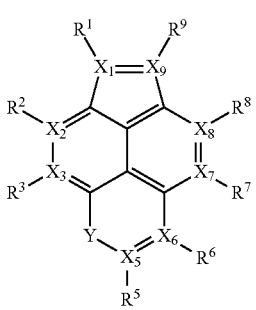
(VI)

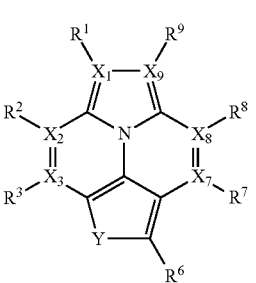
(VII)

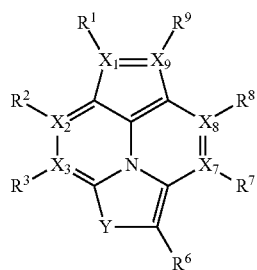
(VIII)

wherein the atoms $X_1, X_2, X_3, X_4, X_5, X_6, X_7, X_8, X_9$, in as far as present, are either all carbon atoms or one may independently be nitrogen and the other being carbons;

if any one $X_1, X_2, X_3, X_4, X_5, X_6, X_7, X_8, X_9$, in as far as present, is nitrogen, the respective substituent ($R^1, R^2, R^3, R^4, R^5, R^6, R^7, R^8, R^9$, respectively) is absent;

Y is selected, independently, from O, S, Se, $SiR^{10}R^{11}$ and $NR^{10}$;

$R^1, R^2, R^3, R^4, R^5, R^6, R^7, R^8, R^9$, in as far as present, are selected independently from H, and C1 to C40 hydrocarbons comprising 0 to 20 heteroatoms, and from C0 to C40 hydrocarbons comprising 1 to 20 heteroatoms; with the proviso that at least one of $R^1, R^2, R^3, R^4, R^5, R^6, R^7, R^8, R^9$ comprises the anchoring group; and, $R^{10}$ are $R^{11}$ are independently selected from H and C1 to C40 hydrocarbons comprising 0 to 20 heteroatoms.

9. The device of claim 8, wherein the compound of formula (I), (II), (IV), (VII) or (VIII) is respectively selected from compounds of formulae (IX) to (XI), (XII) to (XIV), (XV), (XVI), and (XVII) below:

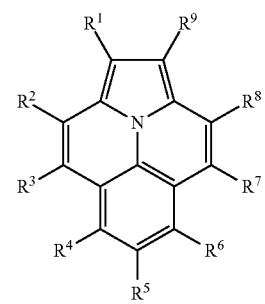
(IX)

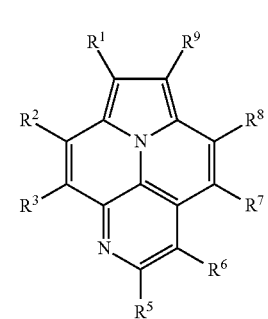
(X)

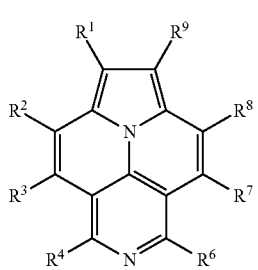

(XI)

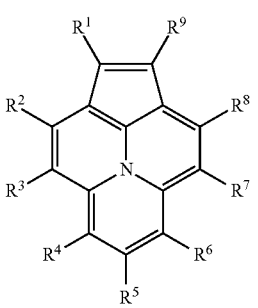

(XII)

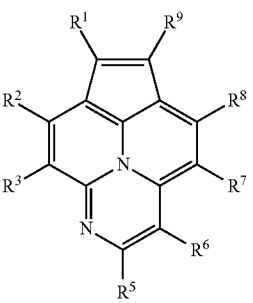

(XIII)

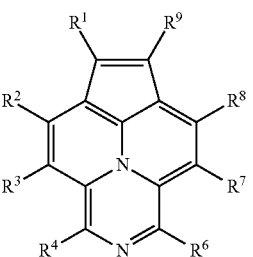

(XIV)

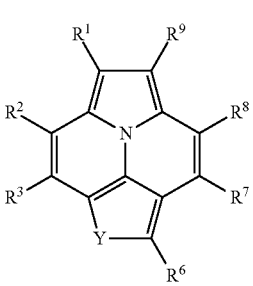

(XV)

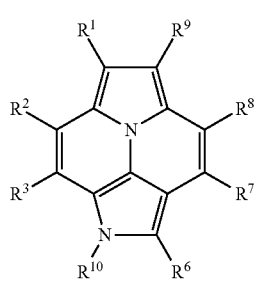

(XVI)

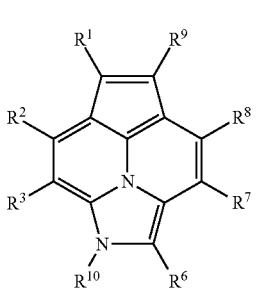

(XVII)

wherein any one of $R^1$ to $R^{10}$, in as far as present, are selected independently from H, and C1 to C40 hydrocarbons comprising 0 to 20 heteroatoms, and from C0 to C40 hydrocarbons comprising 1 to 20 heteroatoms; with the proviso that at least one of $R^1$, $R^2$, $R^3$, $R^4$, $R^5$, $R^6$, $R^7$, $R^8$, $R^9$ and $R^{10}$ comprises the anchoring group; and, Y is selected, independently, from O, S, Se, $SiR^{11}R^{12}$ and $NR^{11}$, $R^{11}$ are $R^{12}$ are independently selected from H and C1 to C40 hydrocarbons comprising 0 to 20 heteroatoms.

10. The device of claim 8, wherein one or more of said substituents $R^1$ to $R^9$, in as far as present, is independently selected from substituents of formula (XVIII) below:

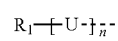

(XVIII)

wherein U is, independently of n, selected from =(ethynylene) and from an ethylene moiety of formula (XIX) below (substituted and unsubstituted vinylene):

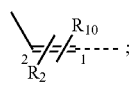

(XIX)

wherein n is selected from 0, and from integers 1 to 10, preferably 0, 1, 2 and 3;

wherein the dotted line in formula (XVIII) and (XIX) represents a single bond to one of the peripheral atoms of the 16 π-electron ring system, or to a linker moiety connecting said substituent of formula (XVIII) to said ring system in a π-conjugated manner;

$R_1$ is selected from a moiety of formula (XX), (XXI) and (XXII) below:

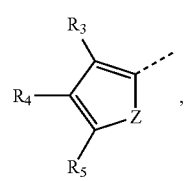
(XX)

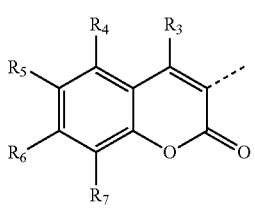
(XXI)

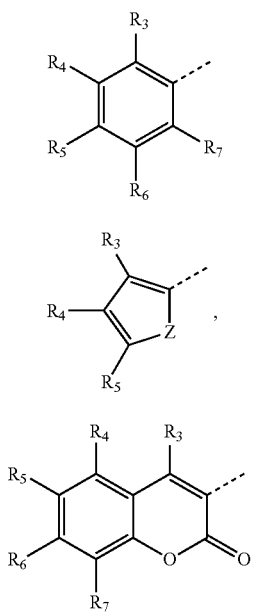
(XXII)

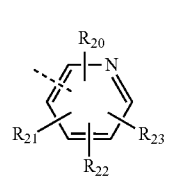
(XXX)

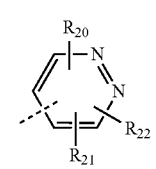
(XXXI)

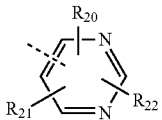
(XXXII)

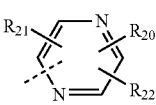
(XXXIII)

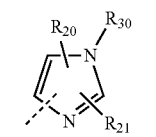
(XXXIV)

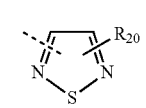
(XXXV)

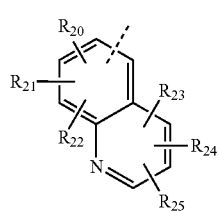
(XXXVI)

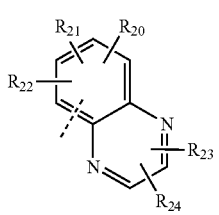
(XXXVII)

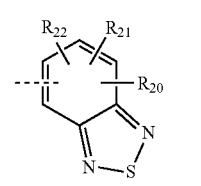
(XXXVIII)

and further from —$OR_8$, —$SR_8$, —$SeR_8$, —$NR_8R_9$, wherein $R_8$ and $R_9$ are independently selected from H and from C1 to C40 hydrocarbons comprising 0 to 20 heteroatoms;

wherein the dotted line in the structure of formulae (XX) to (XXII) represents a single bond by which substituent $R_1$ is connected to the respective carbon of moiety U, or, if n is 0, to one of the peripheral atoms of the 16 π-electron ring system, or to a π-conducting linker moiety connecting said substituent of formula (XVIII) to said ring system;

wherein Z is selected from O, S, Se, $NR_8$, $SiR_8R_9$;

wherein $R_3$, $R_4$, $R_5$, $R_6$, $R_7$, in as far as present, are independently selected from H, $R_8$, $R_9$, —$OR_8$, —$SR_8$, —$SeR_8$, —$NR_8R_9$, wherein any one of $R_3$ to $R_7$ may be connected to another one of substituents $R_3$ to $R_7$ so as to form a ring or ring system fused to said moiety of formula (XX), (XXI) or (XXII), respectively, and, if any one of $R_3$, $R_4$, $R_5$, $R_6$, and $R_7$, is selected from —$OR_8$, —$SR_8$, —$SeR_8$, —$NR_8R_9$, said $R_8$ and/or $R_9$ may, if it is not H, independently be connected with any other one of $R_3$ to $R_7$ so as to form a ring or ring system fused to said moiety of formulae (XX), (XXI) or (XXII), respectively, and wherein, if any one of $R_3$, $R_4$, $R_5$, $R_6$, and $R_7$, is selected from —$NR_8R_9$, said $R_8$ and $R_9$ may be connected to each other so that the respective substituent of $R_3$ to $R_7$ is an N-containing heteroring or ring system bound to said moiety of formulae (XX), (XXI) or (XXII), respectively;

wherein $R_2$ and $R_{10}$ are independently selected from H and substituents as defined for $R_1$.

11. The device of claim 8, wherein one or more of said substituents $R^1$ to $R^9$, in as far as present, comprises a substituent or moiety selected from —CN, —$CF_3$, —F, —Cl, —Br, —I, —$NO_2$, an amide moiety, —COOH, —$COOR_{29}$, —$C(O)R_{29}$, —C(O))H, and from the moieties of formulae (XXX) to (XXXVIII) below:

wherein said amide moiety may in particular be selected from moieties of formulae (XL) to (XLIV) below:

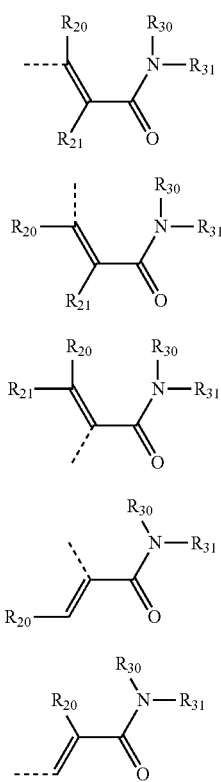

(XL)

(XLI)

(XLII)

(XLIII)

(XLIV)

wherein the dotted line in the structures of formulae (XXX) to (XXXVIII) and (XL) to (XLIV) represents a single bond connecting said structure to one of the peripheral atoms of the 16 π-electron ring system, or to a π-conducting linker moiety connecting said structure to said ring system;

wherein $R_{29}$ is a C1 to C40 hydrocarbon comprising 0 to 20 heteroatoms;

wherein $R_{20}$ to $R_{25}$, in as far as present, are independently selected from H, from C1 to C40 hydrocarbons comprising 0 to 20 heteroatoms, from —F, —Cl, —Br, —I, —NO$_2$, —OH, —SH, and NH$_2$;

wherein $R_{30}$ and $R_{31}$ are independently selected from H and from C1 to C40 hydrocarbons comprising 0 to 20 heteroatoms; and, wherein substituents on neighbouring atoms and/or substituents on atoms that are separated by one or more atoms on one of said moieties (XXX) to (XXXVIII) and (XL) to (XLIV), may be connected to each other to form a ring fused to any one of said moieties (XXX) to (XXXVIII) and (XL) to (XLIV).

12. The device of claim 11, wherein in said moiety of formulae (XLIV), substituents $R_{20}$ and $R_{30}$ are connected to each other so as to form a ring of said moiety, by way of moiety (L) below:

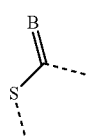

(L)

wherein the dotted line connected to the sulphur atom in the structure of formula (L) represents the single bond of $R_{20}$ in the structure of formula (XLIV) and wherein the dotted line connected the carbon atom in the structure of formula (L) represents the single bond of $R_{30}$ in the structure of formula (XLIV), so that the structures of formulae (XLIV) and (L) form a S and N-containing, five-membered heteroring;

wherein B is selected from O, S and CR$_{27}$R$_{28}$, wherein R$_{27}$ and R$_{28}$ are independently selected from H and from C0 to C20 hydrocarbons comprising 0 to 15 heteroatoms, and wherein R$_{27}$ and R$_{28}$ may be connected to each other so as to form a substituted or unsubstituted ring.

13. The device of claim 11, wherein in said moiety of formulae (XL) and (XLII), substituents $R_{20}$ and $R_{30}$ are connected to each other so as to form a ring of said moiety according to moiety (LI) below:

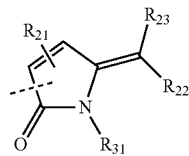

(LI)

wherein $R_{21}$, $R_{22}$, and $R_{23}$, in as far as present, are independently selected from H, from C1 to C40 hydrocarbons comprising 0 to 20 heteroatoms, from —F, —Cl, —Br, —I, —NO$_2$, —OH, —SH, and NH$_2$; wherein $R_{31}$ is independently selected from H and from C1 to C40 hydrocarbons comprising 0 to 20 heteroatoms.

14. The device of claim 1, wherein said anchoring group is selected from —COOH, —PO$_3$H$_2$, —PO$_4$H$_2$, —PO$_2$HR$^{12}$, —SO$_3$H$_2$, —SO$_4$H$_2$, —CONHOH⁻, 1,2 hydroxy benzene, 1-hydroxy-2-carboxy benzene, acetylacetonate, deprotonated forms of the aforementioned, and chelating anchoring groups with π-conducting character, wherein R$^{12}$ is a hydrocarbon comprising 1 to 50 carbons and 0 to 25 heteroatoms.

15. A compound according to any one of formulae (I) to (VIII) below:

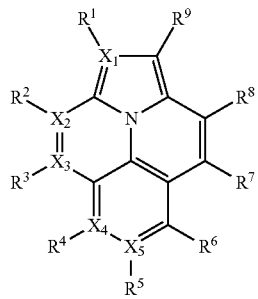

(I)

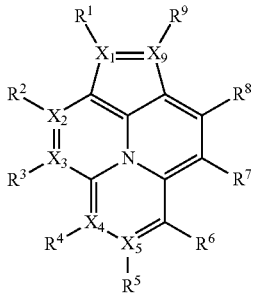

(II)

(III) 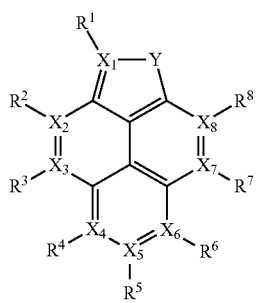

(IV) 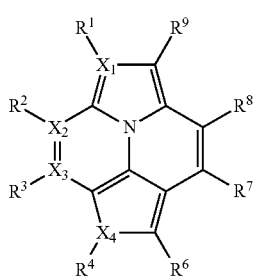

(V) 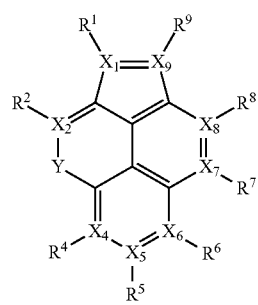

(VI) 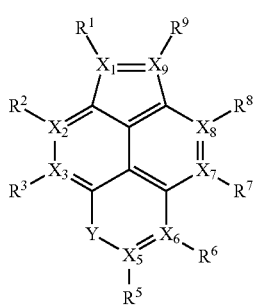

(VII) 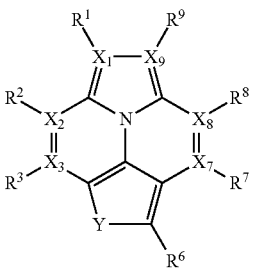

(VIII) 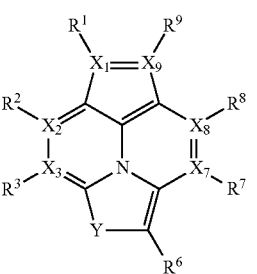

wherein
the atoms $X_1$, $X_2$, $X_3$, $X_4$, $X_5$, $X_6$, $X_7$, $X_8$, $X_9$, in as far as present, are either all carbon atoms or one may independently be nitrogen and the other being carbons;

if any one $X_1$, $X_2$, $X_3$, $X_4$, $X_5$, $X_6$, $X_7$, $X_8$, $X_9$, in as far as present, is nitrogen, the respective substituent ($R^1$, $R^2$, $R^3$, $R^4$, $R^5$, $R^6$, $R^7$, $R^8$, $R^9$, respectively) is absent;

Y is selected, independently, from O, S, Se, $SiR^{10}R^{11}$ and $NR^{10}$;

$R^1$, $R^2$, $R^3$, $R^4$, $R^5$, $R^6$, $R^7$, $R^8$, $R^9$, in as far as present, are selected independently from H, and C1 to C40 hydrocarbons comprising 0 to 20 heteroatoms, and from C0 to C40 hydrocarbons comprising 1 to 20 heteroatoms; with the proviso that at least one of $R^1$, $R^2$, $R^3$, $R^4$, $R^5$, $R^6$, $R^7$, $R^8$, $R^9$ comprises an anchoring group; and, $R^{10}$ are $R^{11}$ independently selected from H and C1 to C40 hydrocarbons comprising 0 to 20 heteroatoms; and wherein the anchoring group is selected from —COOH, —$PO_3H_2$, —$PO_4H_2$, —$PO_2HR^{12}$, —$SO_3H_2$, —$SO_4H_2$, —$CONHOH^-$, 1,2 hydroxy benzene, 1-hydroxy-2-carboxy benzene, acetylacetonate, deprotonated forms of the aforementioned, and chelating anchoring groups with π-conducting character, wherein $R^{12}$ is a hydrocarbon comprising 1 to 50 carbons and 0 to 25 heteroatoms.

* * * * *